(12) United States Patent
Hönel et al.

(10) Patent No.: US 9,098,065 B2
(45) Date of Patent: Aug. 4, 2015

(54) PHOTOPOLYMER FORMULATION FOR PRODUCING HOLOGRAPHIC MEDIA

(75) Inventors: Dennis Hönel, Zülpich-Wichterich (DE); Marc-Stephan Weiser, Leverkusen (DE); Friedrich-Karl Bruder, Krefeld (DE); Thomas Rölle, Leverkusen (DE); Thomas Fäcke, Leverkusen (DE); Horst Berneth, Leverkusen (DE)

(73) Assignee: Bayer Intellectual Property GmbH, Monheim (DE)

( * ) Notice: Subject to any disclaimer, the term of this patent is extended or adjusted under 35 U.S.C. 154(b) by 89 days.

(21) Appl. No.: 13/883,911

(22) PCT Filed: Nov. 4, 2011

(86) PCT No.: PCT/EP2011/069418
§ 371 (c)(1),
(2), (4) Date: Jun. 5, 2013

(87) PCT Pub. No.: WO2012/062658
PCT Pub. Date: May 18, 2012

(65) Prior Publication Data
US 2014/0038084 A1    Feb. 6, 2014

(30) Foreign Application Priority Data
Nov. 8, 2010   (EP) .................................... 10190323

(51) Int. Cl.
*G03H 1/02* (2006.01)
*C08G 18/22* (2006.01)
(Continued)

(52) U.S. Cl.
CPC ............... *G03H 1/02* (2013.01); *C08G 18/222* (2013.01); *C08G 18/227* (2013.01);
(Continued)

(58) Field of Classification Search
CPC .. C08G 18/222; C08G 18/227; C08G 18/242; C08G 18/48; C08G 18/672; G03F 7/001; G03F 7/027; G03F 7/035; G03H 1/02; G03H 2001/185; G03H 2240/11; G03H 2240/50; G03H 2260/12; G03H 2260/14; G03H 2260/31; G11B 7/245; G11B 7/24044
See application file for complete search history.

(56) References Cited

U.S. PATENT DOCUMENTS 3,808,162 A * 4/1974 Allen et al. ...................... 528/49
6,403,702 B1 * 6/2002 Markusch et al. ............. 524/590
(Continued)

FOREIGN PATENT DOCUMENTS

EP    0223587 A1   5/1987
EP    2172502 A1   4/2010
(Continued)

OTHER PUBLICATIONS

Wypych, Handbook of Plasticizers, Chapter 2, pp. 7-71 (2004).*
(Continued)

*Primary Examiner* — Martin Angebranndt
(74) *Attorney, Agent, or Firm* — Drinker Biddle & Reath LLP

(57) ABSTRACT

The invention relates to a photopolymer formulation, comprising at least one polyol component, a polyisocyanate component, a write monomer, a photoinitiator, and a catalyst, wherein the photopolymer formulation has an activation temperature >8300 K. The invention further relates to a method for producing a holographic medium, to a holographic medium that can be obtained according to the method according to the invention, and to the use of a holographic medium according to the invention for producing a hologram.

17 Claims, 2 Drawing Sheets

Arrhenius plot of gel time $t_{Gel}$ versus the inverse absolute temperature $1/T$. The activation temperature $T_{Akt}$ is obtained from the slope of the linear relationship of the natural logarithm of $t_{Gel}$ with $1/T$ by formula (1).

(51) Int. Cl.
| | |
|---|---|
| *C08G 18/24* | (2006.01) |
| *C08G 18/67* | (2006.01) |
| *G03F 7/00* | (2006.01) |
| *G03F 7/027* | (2006.01) |
| *G03F 7/035* | (2006.01) |
| *G11B 7/245* | (2006.01) |
| *G03H 1/18* | (2006.01) |
| *G11B 7/24044* | (2013.01) |

(52) U.S. Cl.
CPC ........... *C08G 18/242* (2013.01); *C08G 18/672* (2013.01); *G03F 7/001* (2013.01); *G03F 7/027* (2013.01); *G03F 7/035* (2013.01); *G11B 7/245* (2013.01); *G03H 1/181* (2013.01); *G03H 2260/14* (2013.01); *G11B 7/24044* (2013.01)

(56) References Cited

U.S. PATENT DOCUMENTS

| | | | |
|---|---|---|---|
| 2006/0040185 A1* | 2/2006 | Takeyama | 430/1 |
| 2007/0060731 A1* | 3/2007 | Wind et al. | 528/44 |
| 2007/0072124 A1* | 3/2007 | Yamada | 430/270.11 |
| 2009/0062419 A1* | 3/2009 | Stockel et al. | 522/109 |
| 2009/0142672 A1* | 6/2009 | Yamada | 430/2 |
| 2010/0086860 A1 | 4/2010 | Roelle et al. | |
| 2010/0086861 A1* | 4/2010 | Weiser et al. | 430/2 |
| 2010/0112459 A1 | 5/2010 | Weiser et al. | |
| 2011/0236803 A1* | 9/2011 | Weiser et al. | 430/2 |
| 2011/0311905 A1 | 12/2011 | Honel et al. | |
| 2012/0214089 A1* | 8/2012 | Honel et al. | 430/2 |
| 2012/0219885 A1* | 8/2012 | Facke et al. | 430/2 |
| 2012/0231377 A1* | 9/2012 | Weiser et al. | 430/2 |
| 2013/0005885 A1* | 1/2013 | Sunayama et al. | 524/320 |
| 2014/0295329 A1* | 10/2014 | Weiser et al. | 430/2 |

FOREIGN PATENT DOCUMENTS

| | | | |
|---|---|---|---|
| EP | 2172505 A1 | | 4/2010 |
| EP | 2218744 A1 | | 8/2010 |
| JP | 2005-181955 | * | 7/2005 |
| WO | WO-03/102959 A1 | | 12/2003 |
| WO | WO-2008/125229 A1 | | 10/2008 |

OTHER PUBLICATIONS

Madbouley et al. "Kinetic analysis of fractal gel formation in waterbourne polyurethane dispersiuons undergoing high deformation flows", Macromol. vol. 39 pp. 41244-4151 (2006).*
Papadopoulos et al., "Reaction kinetics of polyurethane formation using a commercial oligomeric diisocyanate resin studied by calorimetric and rheological methods", Macromol. Chem. Phys., vol. 209 pp. 2309-2311 (2008).*
International Search Report for PCT/EP2011/069418 mailed Feb. 7, 2012.
Acros Organics, Production Specifications for Product 11913 Iron(III) Acetylacetonate, 99+%, 1 page.
Sigma-Aldrich, Product Specification for Iron(III) Acetylacetonate—97%, 1 page.

* cited by examiner

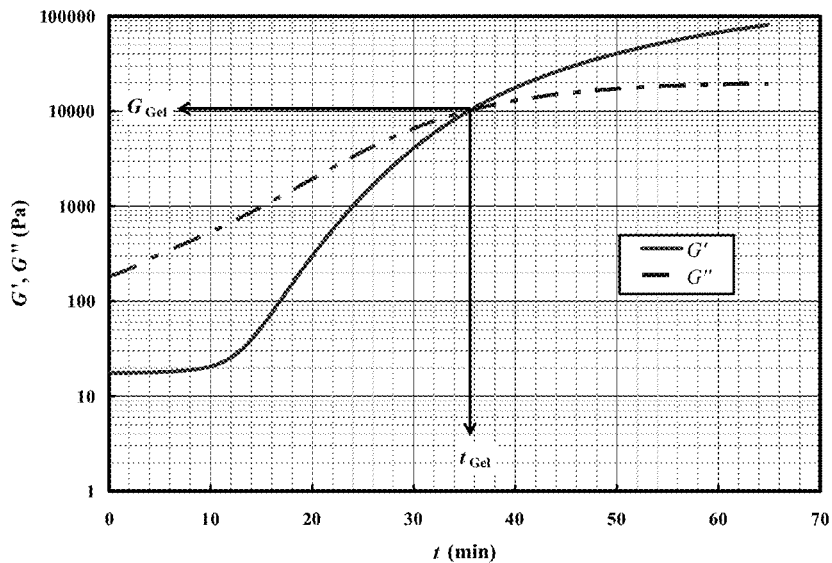

Figure 1: Time course of curing the matrix network from liquid to beyond the gel point. What is measured is the storage modulus $G'$ and the loss modulus $G''$ versus the curing time $t$ at fixed temperature $T$.

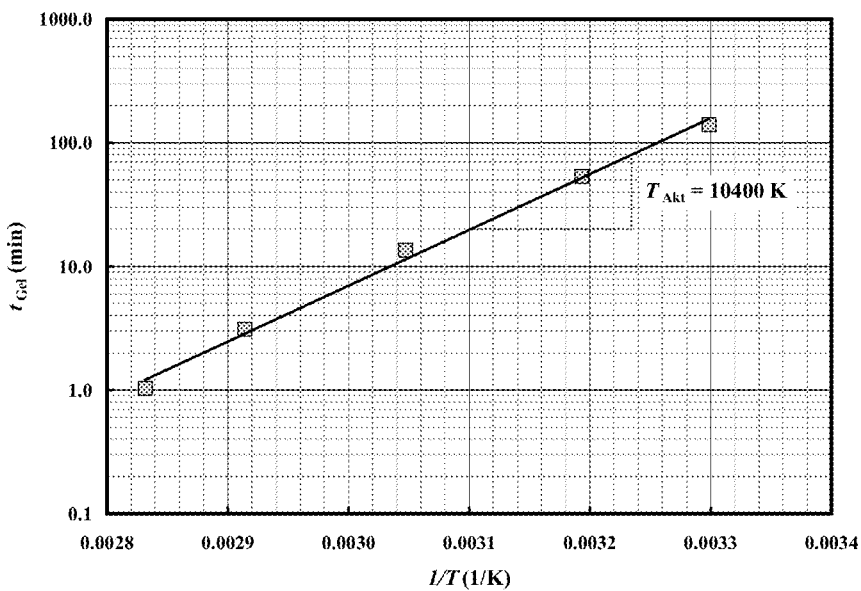

Figure 2: Arrhenius plot of gel time $t_{Gel}$ versus the inverse absolute temperature $1/T$. The activation temperature $T_{Akt}$ is obtained from the slope of the linear relationship of the natural logarithm of $t_{Gel}$ with $1/T$ by formula (1).

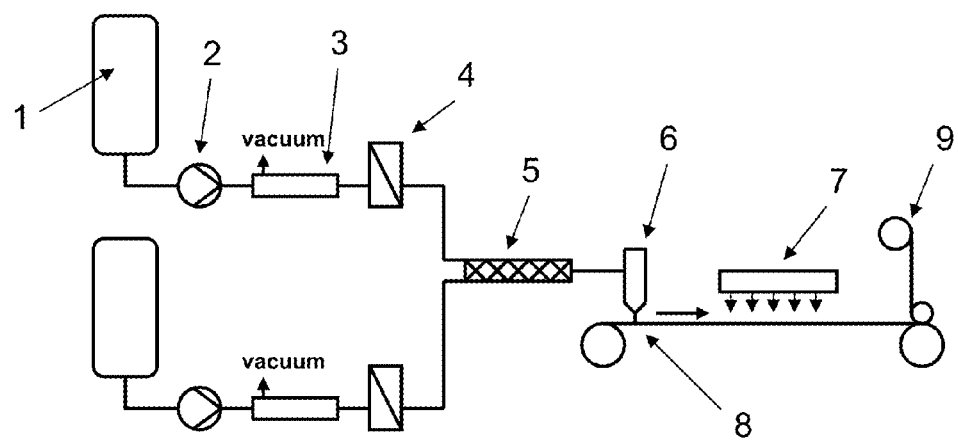
Figure 3: Schematic construction of continuous film coating apparatus used (as reel-to-reel process)

PHOTOPOLYMER FORMULATION FOR PRODUCING HOLOGRAPHIC MEDIA

RELATED APPLICATIONS

This application is a national stage application (under 35 U.S.C. §371) of PCT/EP2011/069418, filed Nov. 4, 2011, which claims benefit of European Patent Application No. 10190323.5, filed Nov. 8, 2010.

The invention relates to a photopolymer formulation comprising at least a polyol component, a polyisocyanate component, a writing monomer, a photoinitiator and a catalyst. The invention further relates to a process for producing a holographic medium, to a holographic medium obtainable by the process of the invention and to the use of a holographic medium of the invention for producing a hologram.

The uses for photopolymer formulations are decisively determined by the refractive index contrast Δn produced in the photopolymer by holographic exposure. In holographic exposure, the interference field of signal light beam and reference light beam (in the simplest case, that of two plane waves) is mapped into a refractive index grating by the local photopolymerization of, for example, high refractive index acrylates at loci of high intensity in the interference field. The refractive index grating in photopolymers (the hologram) contains all the information of the signal light beam. Illuminating the hologram with the reference light beam only will then reconstruct the signal. The strength of the signal thus reconstructed relative to the strength of the incident reference light is called diffraction efficiency, DE in what follows.

In the simplest case of a hologram resulting from the superposition of two plane waves, the DE is the ratio of the intensity of the light diffracted on reconstruction to the sum total of the intensities of the incident reference light and the diffracted light. The higher the DE, the greater the efficiency of a hologram with regard to the amount of reference light needed to visualize the signal with a fixed brightness.

High refractive index acrylates are capable of producing refractive index gratings of high amplitude between regions of low refractive index and regions of high refractive index and hence of producing holograms of high DE and high Δn in photopolymer formulations. It must be noted that DE is dependent on the product of Δn and the photopolymer layer thickness d. The larger the product, the larger the possible DE (for reflection holograms). The width of the angular range in which the hologram is visualized (reconstructed) on monochromatic illumination, for example, is solely dependent on the layer thickness d.

When the hologram is illuminated with white light, for example, the width of the spectral range which can contribute to reconstructing the hologram is likewise only dependent on the layer thickness d. The relationship is that the smaller the d, the greater the particular acceptance widths. Therefore, to produce bright and easily visible holograms, it is generally desirable to seek a high Δn and a low thickness d while maximizing DE. That is, increasing Δn increases the latitude to engineer the layer thickness d without loss of DE for bright holograms. Therefore, the optimization of Δn is of outstanding importance in the optimization of photopolymer formulations (P. Hariharan, Optical Holography, 2nd Edition, Cambridge University Press, 1996).

In order that a very high Δn and DE may be realized for holograms, the matrix polymers and writing monomers of a photopolymer formulation should in principle be chosen such that there is a very large difference in their refractive indices. One possible method of realization is to use matrix polymers having a low refractive index and writing monomers having a high refractive index. Suitable matrix polymers of low refractive index are for example polyurethanes obtainable by reaction of a polyol component with a polyisocyanate component.

WO 2008/125229 A1 describes, for example, a photopolymer formulation for producing bright holograms which comprises a polyol component, a polyisocyanate component, a writing monomer based on acrylate and also photoinitiators containing a coinitiator and a dye. In the cured state, the writing monomer and the photoinitiators form a spatially isotropic distribution embedded in the polyurethane matrix formed from polyol and polyisocyanate components.

European applications EP 2 172 502 A1 and EP 2 172 505 A1 and PCT application WO 03/102959 A1 likewise describe photopolymer formulations comprising a polyol component, a polyisocyanate component, a writing monomer based on acrylate and also photoinitiators containing a coinitiator and a dye. It is additionally stated that catalysts such as tin octoate and iron(III) acetylacetonate can be present in the formulations.

EP 2 218 744 A in turn discloses a large-scale industrial process for producing media, especially in the form of films, from photopolymer formulations of this type. In the process described here, the polyol component, the polyisocyanate component, the writing monomers and the photoinitiators are used to prepare a mixture which is applied to a carrier material and cured there. During curing, the mixture is heated in order that the reaction of the polyol component with the polyisocyanate component to give the polyurethanes forming the matrix may be hastened. Increasing the temperature at this stage may in principle hasten the curing. Yet at temperatures above 90° C. it is not just the polyol component and the polyisocyanate component which react with each other, but the writing monomers may in addition also react in an undesired thermal crosslinking reaction. Therefore, curing cannot be carried out at temperatures significantly above 90° C.

In order that sufficient crosslinking of the polyurethane matrix may be ensured even in the temperature range below 90° C., the curing step has to be appropriately prolonged. In a continuous manufacturing operation such as the reel-to-reel process described in EP 2 218 744 A, this means that either the line speed has to be reduced or the curing zone, in which the film is heated, has to be appreciably prolonged. Either option is disadvantageous from the point of view of costs.

It is known in principle that the urethane formation reaction can be hastened by the addition of catalysts. Catalysts of this type are accordingly also described in EP 2 218 744 A. However, using these catalysts leads to an appreciable reduction in the pot life of the photopolymer formulations, i.e., in the time within which the photopolymer formulation is still straightforward to apply to the carrier material once the components have been mixed at room temperature. The result is that the viscosity of the photopolymer formulation rises substantially even as it is being applied to the carrier material, so uniform application is scarcely still possible or, at a minimum, defects are produced in the final medium.

The problem addressed by the present invention was therefore that of providing a photopolymer formulation of the type mentioned at the beginning which has a very long pot life at room temperature while it is very quick to cure at a temperature in the region of 90° C.

This problem is solved by the photopolymer formulation of the invention by having an activation temperature of ≥8300 K.

Thus, it was found that, surprisingly, photopolymer formulations having an activation temperature ≥8300 K have a very long pot life—and accordingly are efficiently applicable to a carrier material—at room temperature, i.e., in the temperature range from 15 to 40° C. in particular. Conversely, these photopolymer formulations are rapidly curable at a temperature in the region of 90° C., i.e., in the temperature range from 60 to 100° C. in particular. This accordingly means that, for example in continuous manufacturing processes such as the reel-to-reel process, high manufacturing speeds and/or short curing zones are possible, since the photopolymer is quick to become non-blocking and hence windable.

The photopolymer formulations known from the EP 2 172 502 A1, EP 2 172 505 A1 and WO 03/102959 A1 applications as containing tin octoate and iron(III) acetylacetonate have room-temperature activation temperatures <8300 K, as is documented by the corresponding comparative examples in the experimental part of the present application. They accordingly also do not offer the above-recited technical advantages of formulations that are in accordance with the present invention.

In a first preferred embodiment of the invention, the activation temperature of the photopolymer formulation is ≥8700 K, preferably ≥9000 K, more preferably ≥9300 K and even more preferably ≥9500 K. In this case, the photopolymer formulation is particularly quick to cure at a temperature in the region of 90° C.

The activation temperature is preferably determined by using the polyol component, the polyisocyanate component, the writing monomer and the catalyst to prepare a mixture; determining both the storage modulus G' and the loss modulus G" of the mixture over a measurement time t, at least until the condition of the gel point G'=G"=$G_{Gel}$ at time $t_{Gel}$ is reached, at temperatures T=303 K, 313 K, 328 K, 343 K and 353 K using a plate-plate measuring system of a rheometer at a plate spacing of 250 μm in the oscillation mode at a constant frequency f of 10 Hz and a regulated deformation amplitude of 10%; establishing a logarithmic plot of $t_{Gel}$ versus the respective inverse absolute temperature 1/T at which $t_{Gel}$ was determined; and using linear regression to determine the activation temperature $T_{Akt}$ as per the formula $$\ln(t_{Gel}/\min) = T_{Akt}/T + A$$

as the slope of the straight line in the plot.

As polyisocyanate component a) there can be used any compounds known per se to a person skilled in the art, or mixtures thereof, which on average contain two or more NCO functions per molecule. These can be aromatic, araliphatic, aliphatic or cycloaliphatic based. Monoisocyanates and/or unsaturation-containing polyisocyanates can also be used, in minor amounts.

Suitable examples are butylene diisocyanate, hexamethylene diisocyanate (HDI), isophorone diisocyanate (IPDI), 1,8-diisocyanato-4-(isocyanatomethyl)octane, 2,2,4- and/or 2,4,4-trimethylhexamethylene diisocyanate, the isomeric bis(4,4'-isocyanatocyclohexyl)methane and mixtures thereof having any desired isomer content, isocyanatomethyl-1,8-octane diisocyanate, 1,4-cyclohexylene diisocyanate, the isomeric cyclohexanedimethylene diisocyanates, 1,4-phenylene diisocyanate, 2,4- and/or 2,6-tolylene diisocyanate, 1,5-naphthylene diisocyanate, 2,4'- or 4,4'-diphenylmethane diisocyanate and/or triphenylmethane 4,4',4"-triisocyanate.

It is likewise possible to use derivatives of monomeric di- or triisocyanates having urethane, urea, carbodiimide, acylurea, isocyanurate, allophanate, biuret, oxadiazinetrione, uretdione and/or iminooxadiazinedione structures.

Preference is given to using polyisocyanates based on aliphatic and/or cycloaliphatic di- or triisocyanates.

It is particularly preferable for the polyisocyanates of component a) to comprise di- or oligomerized aliphatic and/or cycloaliphatic di- or triisocyanates.

Very particular preference is given to isocyanurates, uretdiones and/or iminooxadiazinediones based on HDI and also 1,8-diisocyanato-4-(isocyanatomethyl)octane or mixtures thereof.

Likewise useful as component a) are NCO-functional prepolymers having urethane, allophanate, biuret and/or amide groups. Prepolymers of component a) are obtained in a well-known conventional manner by reacting monomeric, oligomeric or polyisocyanates a1) with isocyanate-reactive compounds a2) in suitable stoichiometry in the presence or absence of catalysts and solvents.

Useful polyisocyanates a1) include all aliphatic, cycloaliphatic, aromatic or araliphatic di- and triisocyanates known per se to a person skilled in the art, it being immaterial whether they were obtained by phosgenation or by phosgene-free processes. In addition, it is also possible to use the well-known conventional higher molecular weight descendant products of monomeric di- and/or triisocyanates having a urethane, urea, carbodiimide, acylurea, isocyanurate, allophanate, biuret, oxadiazinetrione, uretdione or iminooxadiazinedione structure each individually or in any desired mixtures among each other.

Examples of suitable monomeric di- or triisocyanates useful as component a1) are butylene diisocyanate, hexamethylene diisocyanate (HDI), isophorone diisocyanate (IPDI), trimethylhexamethylene diisocyanate (TMDI), 1,8-diisocyanato-4-(isocyanatomethyl)octane, isocyanatomethyl-1,8-octane diisocyanate (TIN), 2,4- and/or 2,6-toluene diisocyanate.

The isocyanate-reactive compounds a2) for constructing the prepolymers are preferably OH-functional compounds. These are analogous to the OH-functional compounds described hereinbelow for component b).

The use of amines for prepolymer preparation is also possible. For example, ethylenediamine, diethylenetriamine, triethylenetetramine, propylenediamine, diaminocyclohexane, diaminobenzene, diaminobisphenyl, difunctional polyamines, such as, for example, the Jeffamine® amine-terminated polymers having number average molar masses of up to 10 000 g/mol and any desired mixtures thereof with one another are suitable.

For the preparation of prepolymers containing biuret groups, isocyanate is reacted in excess with amine, a biuret group forming. All oligomeric or polymeric, primary or secondary, difunctional amines of the abovementioned type are suitable as amines in this case for the reaction with the di-, tri- and polyisocyanates mentioned.

Preferred prepolymers are urethanes, allophanates or biurets obtained from aliphatic isocyanate-functional compounds and oligomeric or polymeric isocyanate-reactive compounds having number average molar masses of 200 to 10 000 g/mol; particular preference is given to urethanes, allophanates or biurets obtained from aliphatic isocyanate-functional compounds and oligomeric or polymeric polyols or polyamines having number average molar masses of 500 to 8500 g/mol. Very particular preference is given to allophanates formed from HDI or TMDI and difunctional polyetherpolyols having number average molar masses of 1000 to 8200 g/mol.

The prepolymers described above preferably have residual contents of free monomeric isocyanate of less than 1% by weight, particularly preferably less than 0.5% by weight, very particularly preferably less than 0.2% by weight.

In addition to the prepolymers described, the polyisocyanate component can of course contain further isocyanate components proportionately. Aromatic, araliphatic, aliphatic and cycloaliphatic di-, tri- or polyisocyanates are suitable for this purpose. It is also possible to use mixtures of such di-, tri- or polyisocyanates. Examples of suitable di-, tri- or polyisocyanates are butylene diisocyanate, hexamethylene diisocyanate (HDI), isophorone diisocyanate (IPDI), 1,8-diisocyanato-4-(isocyanatomethyl)octane, 2,2,4- and/or 2,4,4-trimethylhexamethylene diisocyanate (TMDI), the isomeric bis(4,4'-isocyanatocyclohexyl)methanes and mixtures thereof having any desired isomer content, isocyanatomethyl-1,8-octane diisocyanate, 1,4-cyclohexylene diisocyanate, the isomeric cyclohexanedimethylene diisocyanates, 1,4-phenylene diisocyanate, 2,4- and/or 2,6-tolylene diisocyanate, 1,5-naphthylene diisocyanate, 2,4'- or 4,4'-diphenylmethane diisocyanate, triphenylmethane 4,4',4"-triisocyanate or derivatives thereof having a urethane, urea, carbodiimide, acylurea, isocyanurate, allophanate, biuret, oxadiazinetrione, uretdione or iminooxadiazinedione structure and mixtures thereof. Preference is given to polyisocyanates based on oligomerized and/or derivatized diisocyanates which were freed from excess diisocyanate by suitable processes, in particular those of hexamethylenediisocyanate. The oligomeric isocyanurates, uretdiones and iminooxadiazinediones of HDI and mixtures thereof are particularly preferred.

It is optionally also possible for the polyisocyanate component a) proportionately to contain isocyanates, which are partially reacted with isocyanate-reactive ethylenically unsaturated compounds. α,β-Unsaturated carboxylic acid derivatives, such as acrylates, methacrylates, maleates, fumarates, maleimides, acrylamides, and vinyl ethers, propenyl ethers, allyl ethers and compounds which contain dicyclopentadienyl units and have at least one group reactive towards isocyanates are preferably used here as isocyanate-reactive ethylenically unsaturated compounds; these are particularly preferably acrylates and methacrylates having at least one isocyanate-reactive group. Suitable hydroxy-functional acrylates or methacrylates are, for example, compounds such as 2-hydroxyethyl (meth)acrylate, polyethylene oxide mono (meth)acrylates, polypropylene oxide mono(meth)acrylates, polyalkylene oxide mono(meth)acrylates, poly(ε-caprolactone) mono(meth)acrylates, such as, for example, Tone® M100 (Dow, USA), hydroxypropyl (meth)acrylate, 4-hydroxybutyl (meth)acrylate, 3-hydroxy-2,2-dimethylpropyl (meth)acrylate, the hydroxy-functional mono-, di- or tetra (meth)acrylates of polyhydric alcohols, such as trimethylolpropane, glycerol, pentaerythritol, dipentaerythritol, ethoxylated, propoxylated or alkoxylated trimethylolpropane, glycerol, pentaerythritol, dipentaerythritol and industrial mixtures thereof. In addition, isocyanate-reactive oligomeric or polymeric unsaturated compounds containing acrylate and/or methacrylate groups, alone or in combination with the abovementioned monomeric compounds, are suitable. The proportion of isocyanates which are partly reacted with isocyanate-reactive ethylenically unsaturated compounds, based on the isocyanate component a), is 0 to 99%, preferably 0 to 50%, particularly preferably 0 to 25% and very particularly preferably 0 to 15%.

It may also be possible for the abovementioned polyisocyanate component a) to contain, completely or proportionately, isocyanates which are reacted completely or partially with blocking agents known to the person skilled in the art from coating technology. The following may be mentioned as an example of blocking agents: alcohols, lactams, oximes, malonic esters, alkyl acetoacetates, triazoles, phenols, imidazoles, pyrazoles and amines, such as, for example, butanone oxime, diisopropylamine, 1,2,4-triazole, dimethyl-1,2,4-triazole, imidazole, diethyl malonate, ethyl acetoacetate, acetone oxime, 3,5-dimethylpyrazole, ε-caprolactam, N-tert-butylbenzylamine, cyclopentanone carboxyethyl ester or any desired mixtures of these blocking agents.

It is particularly preferable for the polyisocyanate component to be an aliphatic polyisocyanate or an aliphatic prepolymer and preferably an aliphatic polyisocyanate or a prepolymer having primary NCO groups.

Any polyfunctional, isocyanate-reactive compounds which have on average at least 1.5 isocyanate-reactive groups per molecule can be used in principle as polyol component b).

In the context of the present invention, isocyanate-reactive groups are preferably hydroxyl, amino or thio groups, and hydroxy compounds are particularly preferred.

Suitable polyfunctional, isocyanate-reactive compounds are, for example, polyester-, polyether-, polycarbonate-, poly(meth)acrylate- and/or polyurethanepolyols.

Suitable polyesterpolyols are, for example, linear polyesterdiols or branched polyesterpolyols, as are obtained in a known manner from aliphatic, cycloaliphatic or aromatic di- or polycarboxylic acids or their anhydrides with polyhydric alcohols having an OH functionality of ≥2.

Examples of such di- or polycarboxylic acids or anhydrides are succinic, glutaric, adipic, pimelic, suberic, azelaic, sebacic, nonanedicarboxylic, decanedicarboxylic, terephthalic, isophthalic, o-phthalic, tetrahydrophthalic, hexahydrophthalic or trimellitic acid and acid anhydrides, such as o-phthalic, trimellitic or succinic anhydride or any desired mixtures thereof with one another.

Examples of suitable alcohols are ethanediol, di-, tri- or tetraethylene glycol, 1,2-propanediol, di-, tri- or tetrapropylene glycol, 1,3-propanediol, 1,4-butanediol, 1,3-butanediol, 2,3-butanediol, 1,5-pentanediol, 1,6-hexanediol, 2,2-dimethyl-1,3-propanediol, 1,4-dihydroxycyclohexane, 1,4-dimethylolcyclohexane, 1,8-octanediol, 1,10-decanediol, 1,12-dodecanediol, trimethylolpropane, glycerol or any desired mixtures thereof with one another.

The polyesterpolyols may also be based on natural raw materials, such as castor oil. It is also possible for the polyesterpolyols to be based on homo- or copolymers of lactones, as can preferably be obtained by an addition reaction of lactones or lactone mixtures, such as butyrolactone, ε-caprolactone and/or methyl-ε-caprolactone, with hydroxy-functional compounds, such as polyhydric alcohols having an OH functionality of ≥2 for example of the aforementioned type.

Such polyesterpolyols preferably have number average molar masses of 400 to 4000 g/mol, particularly preferably of 500 to 2000 g/mol. Their OH functionality is preferably 1.5 to 3.5, particularly preferably 1.8 to 3.0.

Suitable polycarbonatepolyols are obtainable in a manner known per se by reacting organic carbonates or phosgene with diols or diol mixtures.

Suitable organic carbonates are dimethyl, diethyl and diphenyl carbonate.

Suitable diols or mixtures comprise the polyhydric alcohols mentioned in connection with the polyester segments and having an OH functionality of ≥2, preferably 1,4-butanediol, 1,6-hexanediol and/or 3-methylpentanediol, or else polyesterpolyols can be converted into polycarbonatepolyols.

Such polycarbonatepolyols preferably have number average molar masses of 400 to 4000 g/mol, particularly preferably of 500 to 2000 g/mol. The OH functionality of these polyols is preferably 1.8 to 3.2, particularly preferably 1.9 to 3.0.

Suitable polyetherpolyols are polyadducts of cyclic ethers with OH— or NH-functional starter molecules, said polyadducts optionally having a block structure.

Suitable cyclic ethers are, for example, styrene oxides, ethylene oxide, propylene oxide, tetrahydrofuran, butylene oxide, epichlorohydrin and any desired mixtures thereof.

Starters which may be used are the polyhydric alcohols mentioned in connection with the polyesterpolyols and having an OH functionality of ≥2 and primary or secondary amines and amino alcohols.

Preferred polyetherpolyols are those of the abovementioned type, exclusively based on propylene oxide or random or block copolymers based on propylene oxide with further 1-alkylene oxides, the proportion of 1-alkylene oxides being not higher than 80% by weight. Propylene oxide homopolymers and random or block copolymers which have oxyethylene, oxypropylene and/or oxybutylene units are particularly preferred, the proportion of the oxypropylene units, based on the total amount of all oxyethylene, oxypropylene and oxybutylene units, accounting for at least 20% by weight, preferably at least 45% by weight. Here, oxypropylene and oxybutylene comprise all respective linear and branched $C_3$- and $C_4$-isomers.

Such polyetherpolyols preferably have number average molar masses of 250 to 10 000 g/mol, particularly preferably of 500 to 8500 g/mol and very particularly preferably of 600 to 4500 g/mol. The OH functionality is preferably 1.5 to 4.0, particularly preferably 1.8 to 3.1.

In addition, low molecular weight aliphatic, araliphatic or cycloaliphatic di-, tri- or polyfunctional alcohols having molecular weights below 500 g/mol, and are short-chain, i.e., contain 2 to 20 carbon atoms, are also useful as polyfunctional, isocyanate-reactive compounds as constituents of polyol component b).

These can be for example ethylene glycol, diethylene glycol, triethylene glycol, tetraethylene glycol, dipropylene glycol, tripropylene glycol, 1,2-propanediol, 1,3-propanediol, 1,4-butanediol, neopentyl glycol, 2-ethyl-2-butylpropanediol, trimethylpentanediol, positionally isomeric diethyloctanediols, 1,3-butylene glycol, cyclohexanediol, 1,4-cyclohexanedimethanol, 1,6-hexanediol, 1,2-cyclohexanediol, 1,4-cyclohexanediol, hydrogenated bisphenol A (2,2-bis(4-hydroxycyclohexyl)propane), 2,2-dimethyl-3-hydroxypropyl 2,2-dimethyl-3-hydroxypropionate. Examples of suitable triols are trimethylolethane, trimethylolpropane or glycerol. Suitable higher-functional alcohols are ditrimethylolpropane, pentaerythritol, dipentaerythritol or sorbitol.

It is also particularly preferable for the polyol component to have primary OH groups and very preferably to be a difunctional polyether- or polyester or a polyether-polyester block copolymer having primary OH groups.

Particular preference is given to a combination of components a) and b) in the production of matrix polymers consisting of addition products of butyrolactone, e-caprolactone and/or methyl e-caprolactone onto polyetherpolyols having a functionality of 1.8 to 3.1 with number average molar masses of 200 to 4000 g/mol in conjunction with isocyanurates, uretdiones, iminooxadiazinediones and/or other oligomers based on HDI. Very particular preference is given to addition products of e-caprolactone onto poly(tetrahydrofurans) having a functionality of 1.9 to 2.2 and number average molar masses of 500 to 2000 g/mol (especially 600 to 1400 g/mol), the number average overall molar mass of which is from 800 to 4500 g/mol and especially from 1000 to 3000 g/mol, in conjunction with oligomers, isocyanurates and/or iminooxadiazinediones based on HDI.

Writing monomer B) comprises one or more different compounds having groups (radiation-curable groups) which under the influence of actinic radiation react with ethylenically unsaturated compounds by polymerization and themselves being free of NCO groups. The writing monomers are preferably acrylates and/or methacrylates. Urethane acrylates and urethane (meth)acrylates are very particularly preferred.

In one further preferred embodiment, the writing monomer comprises at least a mono- and/or a multi-functional writing monomer, which may more particularly comprise mono- and multi-functional acrylate writing monomers. It is particularly preferable for the writing monomer to comprise at least one monofunctional and one multifunctional urethane (meth)acrylate.

Acrylate writing monomers may be more particularly compounds of general formula (I)

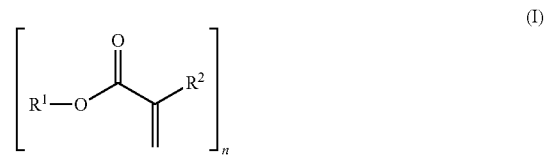

where in each case n is ≥1 and n≤4 and $R^1$, $R^2$ are independently of each other hydrogen, linear, branched, cyclic or heterocyclic unsubstituted or else optionally heteroatom-substituted organic radicals. It is particularly preferable for $R^2$ to be hydrogen or methyl and/or $R^1$ to be a linear, branched, cyclic or heterocyclic unsubstituted or else optionally heteroatom-substituted organic radical.

It is similarly possible to add further unsaturated compounds such as α,β-unsaturated carboxylic acid derivatives such as acrylates, methacrylates, maleates, fumarates, maleimides, acrylamides, also vinyl ether, propenyl ether, allyl ether and dicyclopentadienyl-containing compounds and also olefinically unsaturated compounds such as, for example, styrene, α-methylstyrene, vinyltoluene, olefins, for example 1-octene and/or 1-decene, vinyl esters, (meth)acrylonitrile, (meth)acrylamide, methacrylic acid, acrylic acid. Preference, however, is given to acrylates and methacrylates.

In general, esters of acrylic acid and methacrylic acid are designated as acrylates and methacrylates, respectively. Examples of acrylates and methacrylates which can be used are methyl acrylate, methyl methacrylate, ethyl acrylate, ethyl methacrylate, ethoxyethyl acrylate, ethoxyethyl methacrylate, n-butyl acrylate, n-butyl methacrylate, tert-butyl acrylate, tert-butyl methacrylate, hexyl acrylate, hexyl methacrylate, 2-ethylhexyl acrylate, 2-ethylhexyl methacrylate, butoxyethyl acrylate, butoxyethyl methacrylate, lauryl acrylate, lauryl methacrylate, isobornyl acrylate, isobornyl methacrylate, phenyl acrylate, phenyl methacrylate, p-chlorophenyl acrylate, p-chlorophenyl methacrylate, p-bromophenyl acrylate, p-bromophenyl methacrylate, 2,4,6-trichlorophenyl acrylate, 2,4,6-trichlorophenyl methacrylate, 2,4,6-tribromophenyl acrylate, 2,4,6-tribromophenyl methacrylate, pentachlorophenyl acrylate, pentachlorophenyl methacrylate, pentabromophenyl acrylate, pentabromophenyl methacrylate, pentabromobenzyl acrylate, pentabromobenzyl methacrylate, phenoxyethyl acrylate, phenoxyethyl methacrylate, phenoxyethoxyethyl acrylate, phenoxyethoxyethyl methacrylate, phenylthioethyl acrylate, phenylthioethyl methacrylate, 2-naphthyl acrylate, 2-naphthyl methacrylate, 1,4-bis(2-thionaphthyl)-2-butyl acrylate, 1,4-bis(2-thionaphthyl)-2-butyl methacrylate, propane-2,2-diylbis[(2,6-dibromo-4,1-phenylene)oxy(2-{[3,3,3-tris(4-chlorophenyl)propanoyl]oxy}propane-3,1-diyl)oxyethane-2,1-diyl]diacrylate, bisphenol A diacrylate, bisphenol A dimethacrylate, tetrabromobisphenol A diacrylate, tetrabromobisphenol A dimethacrylate and the ethoxylated analog compounds thereof, N-carbazolyl acrylates, to mention only a selection of acrylates and methacrylates which may be used.

Urethane acrylates are understood as meaning compounds having at least one acrylic acid ester group which additionally have at least one urethane bond. It is known that such compounds can be obtained by reacting a hydroxy-functional acrylic acid ester with an isocyanate-functional compound.

Examples of isocyanate-functional compounds which can be used for this purpose are aromatic, araliphatic, aliphatic and cycloaliphatic di-, tri- or polyisocyanates. It is also possible to use mixtures of such di-, tri- or polyisocyanates. Examples of suitable di-, tri- or polyisocyanates are butylene diisocyanate, hexamethylene diisocyanate (HDI), isophorone diisocyanate (IPDI), 1,8-diisocyanato-4-(isocyanatomethyl) octane, 2,2,4- and/or 2,4,4-trimethylhexamethylene diisocyanate, the isomeric bis(4,4'-isocyanatocyclohexyl)methanes and mixtures thereof having any desired isomer content, isocyanatomethyl-1,8-octane diisocyanate, 1,4-cyclohexylene diisocyanate, the isomeric cyclohexanedimethylene diisocyanates, 1,4-phenylene diisocyanate, 2,4- and/or 2,6-toluene diisocyanate, 1,5-naphthylene diisocyanate, 2,4'- or 4,4'-diphenylmethane diisocyanate, 1,5-naphthylene diisocyanate, m-methylthiophenyl isocyanate, triphenylmethane 4,4', 4"-triisocyanate and tris(p-isocyanatophenyl) thiophosphate or derivatives thereof having a urethane, urea, carbodiimide, acylurea, isocyanurate, allophanate, biuret, oxadiazinetrione, uretdione or iminooxadiazinedione structure and mixtures thereof. Aromatic or araliphatic di-, tri- or polyisocyanates are preferred.

Suitable hydroxy-functional acrylates or methacrylates for the preparation of urethane acrylates are for example compounds such as 2-hydroxyethyl (meth)acrylate, polyethylene oxide mono(meth)acrylates, polypropylene oxide mono (meth)acrylates, polyalkylene oxide mono(meth)acrylates, poly($\epsilon$-caprolactone) mono(meth)acrylates, such as, for example, Tone® M100 (Dow, Schwalbach, Germany), 2-hydroxypropyl (meth)acrylate, 4-hydroxybutyl (meth)acrylate, 3-hydroxy-2,2-dimethylpropyl (meth)acrylate, hydroxypropyl (meth)acrylate, 2-hydroxy-3-phenoxypropyl acrylate, the hydroxyfunctional mono-, di- or tetraacrylates of polyhydric alcohols, such as trimethylolpropane, glycerol, pentaerythritol, dipentaerythritol, ethoxylated, propoxylated or alkoxylated trimethylolpropane, glycerol, pentaerythritol, dipentaerythritol or industrial mixtures thereof. 2-Hydroxyethyl acrylate, hydroxypropyl acrylate, 4-hydroxybutyl acrylate and poly($\epsilon$-caprolactone) mono(meth)acrylates are preferred. In addition, as isocyanate-reactive oligomeric or polymeric unsaturated compounds containing acrylate and/or methacrylate groups, alone or in combination with the abovementioned monomeric compounds, are suitable. The epoxy (meth)acrylates known per se containing hydroxyl groups and having OH contents of 20 to 300 mg KOH/g or polyurethane (meth) acrylates containing hydroxyl groups and having OH contents of 20 to 300 mg KOH/g or acrylated polyacrylates having OH contents of 20 to 300 mg KOH/g and mixtures thereof with one another and mixtures with unsaturated polyesters containing hydroxyl groups and mixtures with polyester (meth)acrylates or mixtures of unsaturated polyesters containing hydroxyl groups with polyester (meth)acrylates can likewise be used.

Preference is given particularly to urethane acrylates obtainable from the reaction of tris(p-isocyanatophenyl)thiophosphate and m-methylthiophenyl isocyanate with alcohol-functional acrylates such as hydroxyethyl(meth)acrylate, hydroxypropyl(meth)acrylate and hydroxybutyl(meth)acrylate.

The employed photoinitiators C) are typically initiators which are activatable by actinic radiation and which trigger a polymerization of the corresponding polymerizable groups. Photoinitiators are commercially available compounds known per se, which are classed as unimolecular (type I) and bimolecular (type II). These initiators are further used according to their chemical type for free-radical polymerization, anionic (or) cationic (or mixed) forms of the aforementioned polymerizations.

The photoinitiators C) may more particularly comprise an anionic, cationic or neutral dye and a co-initiator.

(Type I) systems for free-radical photopolymerization are for example aromatic ketone compounds, for example benzophenones combined with tertiary amines, alkylbenzophenones, 4,4'-bis(dimethylamino)benzophenones (Michler's ketone), anthrone and halogenated benzophenones or mixtures thereof. Also suitable are (type II) initiators such as benzoin and its derivatives, benzil ketals, acylphosphine oxides, e.g. 2,4,6-trimethylbenzoyldiphenylphosphine oxide, bisacylophosphine oxides, phenylglyoxylic esters, camphorquinone, alpha-aminoalkylphenone, alpha,alpha-dialkoxyacetophenone, 1-[4-(phenylthio)phenyl]octane-1,2-dione-2-(O-benzoyl oxime) and alpha-hydroxyalkylphenone.

Similarly, the photoinitiator systems described in EP-A 0 223 587, consisting of a mixture of an ammonium arylborate and one or more dyes, can be used as photoinitiator. Examples of suitable ammonium arylborates are tetrabutylammonium triphenylhexylborate, tetrabutylammonium triphenylbutylborate, tetrabutylammonium trinapthylhexylborate, tetrabutylammonium tris(4-tert-butyl)phenylbutylborate, tetrabutylammonium tris(3-fluorophenyl)hexylborate, tetramethylammonium triphenylbenzylborate, tetra(n-hexyl) ammonium (sec-butyl)triphenylborate, 1-methyl-3-octylimidazolium dipentyldiphenylborate and tetrabutylammonium tris-(3-chloro-4-methylphenyl)hexylborate (Cunningham et al., RadTech'98 North America UV/EB Conference Proceedings, Chicago, Apr. 19-22, 1998).

The photoinitiators used for the anionic polymerization are generally (type I) systems and are derived from transition metal complexes of the first series. Chromium salts, for example trans-Cr(NH$_3$)$_2$(NCS)$_4^-$ (Kutal et al, Macromolecules 1991, 24, 6872) or ferrocenyl compounds (Yamaguchi et al. Macromolecules 2000, 33, 1152) must be mentioned here. A further possibility of anionic polymerization consists in the use of dyes, such as crystal violet leuconitrile or malachite green leuconitrile, which are capable of polymerizing cyanoacrylates by photolytic decomposition (Neckers et al. Macromolecules 2000, 33, 7761). However, the chromophore becomes incorporated in the polymer in the process, so the resulting polymers are intrinsically colored.

The photoinitiators used for cationic polymerization consist essentially of three classes: aryldiazonium salts, onium salts (here specifically: iodonium, sulfonium and selenonium salts) and organometallic compounds. Phenyldiazonium salts are able to produce a cation that initiates the polymerization when they are irradiated in the presence or in the absence of a hydrogen donor. The efficiency of the overall system is determined by the nature of the ion used as counter-ion to the diazonium compound. Preference is given here to SbF$_6^-$, AsF$_6^-$ or PF$_6^-$, which are not very reactive but may be expensive. These compounds are generally not very suitable for use in coating thin films, since the nitrogen released on exposure reduces the surface quality (pinholes) (Li et al., Polymeric Materials Science and Engineering, 2001, 84, 139).

Onium salts, specifically sulfonium salts and iodonium salts, are very widely used and also commercially available in many forms. The photochemistry of these compounds has been the subject of sustained interest. Iodonium salts when excited initially decompose homolytically and thus produce a free radical and a free radical anion which stabilizes by hydrogen abstraction and releases a proton and then initiates the cationic polymerization (Dektar et al. J. Org. Chem. 1990, 55, 639; J. Org. Chem., 1991, 56. 1838). This mechanism makes it possible to use iodonium salts for free-radical photopolymerization also. Again, the choice of counter-ion is very important here and preference is likewise given to $SbF_6^-$, $AsF_6^-$ or $PF_6^-$. Otherwise, the choice of substitution for the aromatic moiety is fairly free with this structural class, being essentially determined by the availability of suitable starting synthons for the synthesis.

The sulfonium salts are compounds which decompose by Norrish(II) (Crivello et al., Macromolecules, 2000, 33, 825). The choice of counter-ion in the sulfonium salts again has a critical importance which is essentially reflected in the curing rate of the polymers. The best results are generally achieved with $SbF_6^-$ salts.

Since the self-absorption of iodonium and sulfonium salts is at <300 nm, these compounds have to be appropriately sensitized for the photopolymerization with near UV or shortwave visible light. This is accomplished by the use of more highly absorbing aromatics such as, for example, anthracene and derivatives (Gu et al., Am. Chem. Soc. Polymer Preprints, 2000, 41 (2), 1266) or phenothiazine and/or its derivatives (Hua et al, Macromolecules 2001, 34, 2488-2494).

It can be advantageous to use mixtures of these compounds. Depending on the radiation source used for curing, type and concentration of photoinitiator have to be adapted in a manner known to a person skilled in the art. Further particulars are available for example from P. K. T. Oldring (Ed.), Chemistry & Technology of UV & EB Formulations For Coatings, Inks & Paints, Vol. 3, 1991, SITA Technology, London, pp. 61-328.

Preferred photoinitiators C) are mixtures of tetrabutylammonium tetrahexylborate, tetrabutylammonium triphenylhexylborate, tetrabutylammonium triphenylbutylborate, tetrabutylammonium tris(3-fluorophenyl)hexylborate ([191726-69-9], CGI 7460, product from BASF SE, Basle, Switzerland) and tetrabutylammonium tris(3-chloro-4-methylphenyl)hexylborate ([1147315-11-4], CGI 909, product from BASF SE, Basle, Switzerland) with cationic dyes as described for example in H. Berneth in Ullmann's Encyclopedia of Industrial Chemistry, Cationic Dyes, Wiley-VCH Verlag, 2008. These cationic dyes preferably conform to the formula $F^+An^-$.

Cationic dyes of formula $F^+$ are preferably to be understood as meaning cationic dyes of the following classes: acridine dyes, xanthene dyes, thioxanthene dyes, phenazine dyes, phenoxazine dyes, phenothiazine dyes, tri(het)arylmethane dyes—particularly diamino- and triamino(het)arylmethane dyes, mono-, di- and trimethinecyanine dyes, hemicyanine dyes, externally cationic merocyanine dyes, externally cationic neutrocyanine dyes, nullmethine dyes— particularly naphtholactam dyes, streptocyanine dyes. Dyes of this type are described for example in H. Berneth in Ullmann's Encyclopedia of Industrial Chemistry, Azine Dyes, Wiley-VCH Verlag, 2008, H. Berneth in Ullmann's Encyclopedia of Industrial Chemistry, Methine Dyes and Pigments, Wiley-VCH Verlag, 2008, T. Gessner, U. Mayer in Ullmann's Encyclopedia of Industrial Chemistry, Triarylmethane and Diarylmethane Dyes, Wiley-VCH Verlag, 2000.

An is to be understood as meaning an anion. Preferred anions An are in particular $C_8$- to $C_{25}$-alkanesulfonate, preferably $C_{13}$- to $C_{25}$-alkanesulfonate, $C_3$- to $C_{18}$-perfluoroalkanesulfonate, preferably $C_4$- to $C_{18}$-perfluoroalkanesulfonate, $C_9$- to $C_{25}$-alkanoate, $C_9$- to $C_{25}$-alkenoate, $C_8$- to $C_{25}$-alkyl sulfate, preferably $C_{13}$- to $C_{25}$-alkyl sulfate, $C_8$- to $C_{25}$-alkenyl sulfate, preferably $C_{13}$- to $C_{25}$-alkenyl sulfate, $C_3$- to $C_{18}$-perfluoroalkyl sulfate, preferably $C_4$- to $C_{18}$-perfluoroalkyl sulfate, polyether sulfates based on 4 or more equivalents of ethylene oxide and/or equivalents 4 propylene oxide, bis-$C_4$- to $C_{25}$-alkyl, $C_5$- to $C_7$-cycloalkyl, $C_3$- to $C_8$-alkenyl or $C_7$- to $C_{11}$-aralkyl sulfosuccinate, bis-$C_2$- to $C_{10}$-alkyl sulfosuccinate substituted by 8 or more fluorine atoms, $C_8$- to $C_{25}$-alkyl sulfoacetates, benzenesulfonate substituted by at least one moiety from the group halogen, $C_4$- to $C_{25}$-alkyl, perfluoro-$C_1$- to $C_8$-alkyl and/or $C_1$- to $C_{12}$-alkoxycarbonyl, optionally nitro-, cyano-, hydroxyl-, $C_1$- to $C_{25}$-alkyl-, $C_1$- to $C_{12}$-alkoxy-, amino-, $C_1$- to $C_{12}$-alkoxycarbonyl- or chlorine-substituted naphthalene- or biphenylsulfonate, optionally nitro-, cyano-, hydroxyl-, $C_1$- to $C_{25}$-alkyl-, $C_1$- to $C_{12}$-alkoxy-, $C_1$- to $C_{12}$-alkoxycarbonyl- or chlorine-substituted benzene-, naphthalene- or biphenyldisulfonate, dinitro-, $C_6$- to $C_{25}$-alkyl-, $C_4$- to $C_{12}$-alkoxycarbonyl-, benzoyl-, chlorobenzoyl- or toluoyl-substituted benzoate, the anion of naphthalenedicarboxylic acid, diphenyl ether disulfonate, sulfonated or sulfated, optionally mono- or polyunsaturated $C_8$- to $C_{25}$-fatty acid esters of aliphatic $C_1$- to $C_8$-alcohols or glycerol, bis(sulfo-$C_2$- to $C_6$-alkyl) $C_3$- to $C_{12}$-alkanedicarboxylic esters, bis(sulfo-$C_2$- to $C_6$-alkyl) itaconic acid esters, (sulfo-$C_2$- to $C_6$-alkyl) $C_6$- to $C_{18}$-alkanecarboxylic esters, (sulfo-$C_2$- to $C_6$-alkyl) acrylic or methacrylic acid esters, triscatechol phosphate optionally substituted by up to 12 halogen moieties, an anion from the group tetraphenyl borate, cyanotriphenyl borate, tetraphenoxyborate, $C_4$- to $C_{12}$-alkyltriphenyl borate, the phenyl or phenoxy moieties of which may be halogen, $C_1$- to $C_4$-alkyl and/or $C_1$- to $C_4$-alkoxy substituted, $C_4$- to $C_{12}$-alkyltrinaphthyl borate, tetra-$C_1$- to $C_{20}$-alkoxyborate, 7,8- or 7,9-dicarbanidoundecaborate(1-) or (2-), which optionally bear on the B and/or C atoms one or two $C_1$- to $C_{12}$-alkyl or phenyl group substituents, dodecahydrodicarbadodecaborate(2-) or B—$C_1$- to $C_{12}$-alkyl-C-phenyldodecahydrodicarbadodecaborate(1-), where $An^-$ in multivalent anions such as naphthalenedisulfonate represents one equivalent of this anion, and where the alkane and alkyl groups may be branched and/or may be halogen, cyano, methoxy, ethoxy, methoxycarbonyl or ethoxycarbonyl substituted.

Particularly preferred anions are sec-$C_{11}$- to $C_{18}$-alkanesulfonate, $C_{13}$- to $C_{25}$-alkyl sulfate, branched $C_8$- to $C_{25}$-alkyl sulfate, optionally branched bis-$C_6$- to $C_{25}$-alkyl sulfosuccinate, sec- or tert-$C_4$- to $C_{25}$-alkylbenzenesulfonate, sulfonated or sulfated, optionally mono- or polyunsaturated $C_8$- to $C_{25}$-fatty acid esters of aliphatic $C_1$- to $C_8$-alcohols or glycerol, bis(sulfo-$C_2$- to $C_6$-alkyl) $C_3$- to $C_{12}$-alkanedicarboxylic esters, (sulfo-$C_2$- to $C_6$-alkyl) $C_6$- to $C_{18}$-alkanecarboxylic esters, triscatechol phosphate substituted by up to 12 halogen moieties, cyanotriphenyl borate, tetraphenoxyborate.

It is also preferable for the anion $An^-$ of the dye to have an ACIogP in the range of 1-30, more preferably in the range of 1-12 and even more preferably in the range of 1-6.5. ACIogP is computed as described in J. Comput. Aid. Mol. Des. 2005, 19, 453; Virtual Computational Chemistry Laboratory, http://www.vcclab.org.

Particular preference is given to dyes $F^+An^-$ having a water imbibition 5 wt %.

Water imbibition is apparent from formula (F-1)

$$W=(m_f/m_t-1)*100\%\quad(F-1),$$

where $m_f$ is the mass of the dye after water saturation and $m_t$ is the mass of the dried dye. $m_t$ is ascertained by drying a particular quantity of dye to constant mass, for example at elevated temperature in vacuo. $m_f$ is determined by letting a particular quantity of dye stand in air at a defined humidity to constant weight.

In a further preferred embodiment, the photoinitiators C) are mixtures of tetrabutylammonium tetrahexylborate, tetrabutylammonium triphenylhexylborate, tetrabutylammonium triphenylbutylborate, tetrabutylammonium tris(3-fluorophenyl)hexylborate ([191726-69-9], CGI 7460, product from BASF SE, Basle, Switzerland) and tetrabutylammonium tris(3-chloro-4-methylphenyl)hexylborate ([1147315-11-4], CGI 909, product from BASF SE, Basle, Switzerland) with dyes such as, for example, Astrazone Orange G, Basic Blue 3, Basic Orange 22, Basic Violet 7, methylene blue, new methylene blue, azure A, pyrillium I, safranine O, cyanine, gallocyanine, brilliant green, crystal violet, ethyl violet and thionine. It is particularly preferable for the aforementioned dyes to have the above-recited anions.

It is very particularly preferable when the photoinitiator comprises a combination of dyes by whose absorption spectra the spectral region from 400 to 800 nm is at least partly covered with at least one coinitiator adapted to the dyes.

The catalyst c) may comprise more particularly compounds of general formula (II)

$$RSnL_3 \qquad (II)$$

where

R is a linear or branched alkyl radical of 1-30 carbon atoms which is optionally substituted with heteroatoms, especially with oxygen, even in the chain, and each L is independently of the others an $^-O_2C-R^3$ group wherein $R^3$ is a linear or branched alkyl radical of 1-30 carbon atoms which is optionally substituted with heteroatoms, especially with oxygen, even in the chain, an alkenyl radical of 2-30 carbon atoms or any desired substituted or unsubstituted optionally polycyclic aromatic ring with or without heteroatoms.

It is particularly preferable here when R is a linear or branched alkyl radical of 1-12 carbon atoms, more preferably a methyl, ethyl, propyl, n-, i-, t-butyl, n-octyl radical and even more preferably an n-, i-, t-butyl radical and/or $R^3$ is a linear or branched alkenyl radical of 2-17 carbon atoms or alkyl radical of 1-17 carbon atoms optionally substituted with heteroatoms, especially with oxygen, even in the chain, more preferably a linear or branched alkyl or alkenyl radical of 3-13 carbon atoms and even more preferably a linear or branched alkyl or alkenyl radical of 5-11 carbon atoms and more particularly each L is the same.

Further suitable catalysts are for example compounds of general formula (III) or (IV)

$$Bi(III)M_3 \qquad (III),$$

$$Sn(II)M_2 \qquad (IV),$$

where each M is independently of the others an $^-O_2C-R^4$ group wherein $R^4$ is a saturated or unsaturated or heteroatom-substituted $C_1$- to $C_{19}$-alkyl radical or $C_2$- to $C_{19}$ alkenyl radical, especially a $C_6$- to $C_{11}$-alkyl radical and more preferably a $C_7$- to $C_9$-alkyl radical or is a $C_1$- to $C_{18}$-alkyl radical which is optionally substituted aromatically or with oxygen or nitrogen in any desired form, wherein M in the formula (III) and (IV) need not have the same meaning.

Further suitable catalysts are for example compounds of general formula (V)

$$FeQ_3 \qquad (V),$$

where each Q is independently of the others an organic anion of formula (Va),

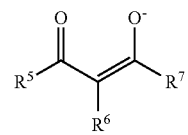
(Va)

where $R^5$ and $R^7$ are each independently of each other an optionally heteroatom-substituted $C_1$- to $C_{18}$-alkyl radical or $C_2$-$C_{18}$ alkenyl radical, especially a $C_1$- to $C_{10}$-alkyl radical and more preferably a $C_1$- to $C_4$-alkyl radical or $R^5$ and $R^6$ combine to form a bridge, for example from —$CH_2$—$CH_2$—$CH_2$—, —$CH_2$—$CH_2$—$CH_2$—$CH_2$—, —$CH_2$—$CH_2$—$CH_2$—$CH_2$—$CH_2$—, —CH=CH—CH=CH—, or an optionally heteroatom-substituted aromatic or heteroaromatic ring and $R^6$ is methyl or hydrogen.

It is therefore particularly preferable for the urethanization catalyst c) to be selected from the group of the abovementioned compounds of formulae (II), (III), (IV) and/or (V).

It is therefore very particularly preferred for the urethanization catalyst c) to be selected from the group of the abovementioned compounds of formulae (II), (III) and/or (IV).

The terms alkyl radical and alkyl radical optionally substituted aromatically or with oxygen or nitrogen in any desired form are to be understood as meaning linear or branched alkyl radicals, for example methyl, ethyl, the isomeric propyls, the isomeric butyls, the isomeric pentyls, the isomeric hexyls, the isomeric octyls, the isomeric decyls, the isomeric dodecyls, the isomeric hexadecyls, the isomeric heptadecyls, the isomeric octadecyls, cyclohexyl-methyl, methoxyethyl, methoxypropyl, methoxybutyl, ethoxyethyl, ethoxypropyl, ethoxybutyl, ethoxyethoxyethyl, dimethylaminoethyl, dimethylaminobutyl, N-morpholino-methyl, N-morpholinoethyl, benzyl, phenethyl, phenylpropyl, naphtylmethyl, pyridylmethyl, pyridylethyl.

An alkenyl radical is to be understood as meaning an alkyl radical as described above having at least 3 carbon atoms and at least one carbon double bond. Examples thereof are, allyl, homoally, the isomeric pentenyls, the isomeric hexenyls, the isomeric octenyls, the isomeric decenyls, the isomeric undecenyls, the isomeric heptadecenyls, the isomeric heptadecadienyls.

By any desired substituted or unsubstituted optionally polycyclic aromatic ring with or without heteroatoms is meant for example: phenyl, tolyl, xylyl, chlorophenyl, anisyl, nitrophenyl, naphthyl, pyridyl, thienyl.

Examples of suitable catalysts c) are methyltin tris(2-ethylhexanoate), ethyltin tris(2-ethylhexanoate), propyltin tris(2-ethylhexanoate), butyltin tris(2-ethylhexanoate), hexyltin tris(2-ethylhexanoate), methyltin tris(acetate), ethyltin tris(acetate), propyltin tris(acetate), butyltin tris(acetate), hexyltin tris(acetate), methyltin tris(propionate), ethyltin tris(propionate), propyltin tris(propionate), butyltin tris(propionate), hexyltin tris(propionate), methyltin tris(butyrate), ethyltin tris(butyrate), propyltin tris(butyrate), butyltin tris(butyrate), hexyltin tris(butyrate), methyltin tris(hexanoate), ethyltin tris(hexanoate), propyltin tris(hexanoate), butyltin tris(hexanoate), hexyltin tris(hexanoate), methyltin tris(decanoate), ethyltin tris(decanoate), propyltin tris(decanoate), butyltin tris(decanoate), hexyltin tris(decanoate), bismuth(III) tris (hexanoate), bismuth(III) tris(heptanoate), bismuth(III) tris (octanoate), bismuth(III) tris(nonanoate), bismuth(III) tris (decanoate), bismuth(III) tris(dodecanoate), bismuth(III) tris (neodecanoate), bismuth(III) subgallate, bismuth(III) subsalicylate, tin(II) bis(acetate), tin(II) bis(propionate), tin (II) bis(butyrate), tin(II) bis(pentanoate), tin(II) bis(hexanoate), tin(II) bis(2-ethylhexanoate), tin(II) bis(octoate), tin (II) bis(nonanoate), tin(II) bis(decanoate), tin(II) bis (dodecanoate), tin(II) bis(oleate), iron(III) tris((2Z)-3-hydroxy-1,3-diphenylprop-2-en-1-one), iron(III) tris(3-hydroxy-5-(4-methylphenyl)cyclohex-2-en-1-one), iron(III) tris(5-hexyl-3-hydroxycyclohex-2-en-1-one), iron(III) tris ((3E)-1,1,1,5,5,5-hexafluoro-4-hydroxypent-3-en-2-one), iron[iii]tris-acetylacetonate, iron(III) tris(3-hydroxycyclopent-2-en-1-one), iron(III) tris((4E)-5-hydroxyhex-4-en-3-one), iron(III) tris((3Z)-4-hydroxy-4-phenylbut-3-en-2-one), iron(III) tris((2Z)-3-(3-chlorophenyl)-1-cyclopropyl-3-hydroxyprop-2-en-1-one), iron(III) tris((1Z)-1-(4-fluorophenyl)-1-hydroxy-4-methylpent-1-en-3-one), iron(III) tris ((2Z)-1-(2,4-dichlorophenyl)-4,4,4-trifluoro-3-hydroxybut-2-en-1-one), iron(III) tris((2Z)-1-(4-chlorophenyl)-4,4,4-trifluoro-3-hydroxybut-2-en-1-one), iron(III) tris(-acetyl-3-oxo-N-phenylbutanethioamide), iron(III) tris(methyl 3-acetyl-4-oxopentanoate), iron(III) tris([(methylsulfanyl) methyl]pentane-2,4-dione), iron(III) tris(3-(4-nitrophenyl) pentane-2,4-dione), iron(III) tris(3-acetylhexane-2,5-dione), iron(III) tris(4-acetyl-5-oxohexanenitrile), iron(III) tris(3-[(phenylsulfonyl)methyl]pentane-2,4-dione), iron(III) tris(3-fluoropentane-2,4-dione), iron(III) tris(3-benzylpentane-2,4-dione), iron(III) tris(3-(pyridin-3-ylmethyl)pentane-2,4-dione), iron(III) tris(3-tert-butylpentane-2,4-dione), iron(III) tris(3-propylpentane-2,4-dione), iron(III) tris(3-phenylpentane-2,4-dione), iron(III) tris(3-pentylpentane-2,4-dione), iron(III) tris(3-butylpentane-2,4-dione), iron(III) tris(3-(4-chlorobenzyl)pentane-2,4-dione), iron(III) tris(3-methylpentane-2,4-dione).

Particularly preferred catalysts c) are butyltin tris(2-ethylhexanoate), iron[iii]tris-acetylacetonate, bismuth(III) tris(2-ethylhexanoate) and tin(II) bis(2-ethylhexanoate).

In a further preferred embodiment, the photopolymer formulation additionally contains plasticizers D) and more preferably urethanes as plasticizers, which urethanes may be more particularly substituted with at least a fluorine atom.

The urethane plasticizers may preferably have the general formula (VI)

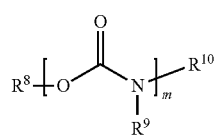

(VI)

where m is ≥1 and ≤8 and $R^8$, $R^9$, $R^{10}$ are independently of each other hydrogen, linear, branched, cyclic or heterocyclic unsubstituted or else optionally heteroatom-substituted organic radicals, wherein preferably at least one of $R^8$, $R^9$, $R^{10}$ is substituted with at least a fluorine atom and more preferably $R^8$ is an organic radical having at least one fluorine atom. It is particularly preferable for $R^8$ to be a linear, branched, cyclic or heterocyclic organic radical which is unsubstituted or optionally substituted even with heteroatoms such as fluorine for example.

The photopolymer formulations of the invention may preferably comprise
  10 to 84.999 wt % of polyol component a),
  2 to 30 wt % of polyisocyanate component b),
  10 to 60 wt % of writing monomer B),
  0.001 to 10 wt % of photoinitiator C),
  0.001 to 4 wt % of catalyst c) and optionally
  0 to 30 wt % of plasticizer D),
where the weight percent totals always add up to one hundred weight percent.

It is very particularly preferable for the photopolymer formulation to comprise
  25 to 70 wt % of polyol component a),
  5 to 25 wt % of polyisocyanate component b),
  25 to 50 wt % of writing monomer B),
  0.01 to 5 wt % of photoinitiator C),
  0.01 to 2 wt % of catalyst c) and optionally
  0 to 25 wt % of plasticizer D),
where the weight percent totals always add up to one hundred weight percent.

The invention also provides a holographic medium containing a photopolymer formulation of the invention or obtainable using a photopolymer formulation of the invention. The invention yet further provides for the use of a photopolymer formulation of the invention for producing holographic media.

The photopolymer formulations of the invention are especially useful for producing holographic media.

The invention accordingly also provides a process for producing a holographic medium wherein
  (I) a photopolymer formulation of the invention is prepared by mixing all constituents,
  (II) the photopolymer formulation is processed at a processing temperature into the form desired for the holographic medium, and
  (III) is cured in the desired form by urethane formation at a crosslinking temperature above the processing temperature.

The processing temperature can be in particular ≥15 and ≤40° C. and preferably ≥18 and ≤25° C.

The photopolymer formulation is preferably processed in step II) into the form of a film. For this, the photopolymer formulation can be applied for example flat to a carrier substrate, in which case for example the devices known to a person skilled in the art such as a blade coater (doctor blade, knife-over-roll, Commabar and so on) or a slot die can be used.

The carrier substrate used can be one ply of a material or assembly of materials which is transparent to light in the visible spectrum (transmission greater than 85% in the wavelength range from 400 to 780 nm).

Preferred materials or assemblies of materials for the carrier substrate are based on polycarbonate (PC), polyethylene terephthalate (PET), polybutylene terephthalate, polyethylene, polypropylene, cellulose acetate, cellulose hydrate, cellulose nitrate, cycloolefin polymers, polystyrene, polyepoxides, polysulfone, cellulose triacetate (CTA), polyamide, polymethyl methacrylate, polyvinyl chloride, polyvinyl butyral or polydicyclopentadiene or mixtures thereof. They are more preferably based on PC, PET and CTA. Assemblies of materials can be laminates of self-supporting polymeric sheets, or coextrudates. Preferred assemblies of materials are duplex and triplex films constructed according to one of the schemes A/B, A/B/A or A/B/C. Particular preference is given to PC/PET, PET/PC/PET and PC/TPU (TPU=thermoplastic polyurethane).

As an alternative to the abovementioned carrier substrates, it is also possible to use planar glass plates, which are used particularly for large-area accurately imaging exposures, for example for holographic lithography (Holographic interference lithography for integrated optics. IEEE Transactions on Electron Devices (1978), ED-25(10), 1193-1200, ISSN: 0018-9383).

The materials or assemblies of materials of the carrier substrate may have an anti-stick, antistatic, hydrophobic or hydrophilic finish on one or both sides. On the side facing the photopolymer, the modifications mentioned serve the purpose of making it possible to remove the photopolymer from the carrier substrate non-destructively. A modification of that side of the carrier substrate which faces away from the photopolymer serves to ensure that the media of the present invention meet specific mechanical requirements, required for example in relation to processing in reel laminators, more particularly in reel-to-reel processes.

The carrier substrate may have a coating on one side or on both sides.

The crosslinking temperature can be especially ≥60° C. and ≤100° C. and preferably ≥70° C. and ≤95° C. and more preferably ≥75° C. and ≤90° C.

The invention also provides a holographic medium obtainable by the process of the invention.

The invention yet further provides a layered construction comprising a carrier substrate, a film applied thereto of a photopolymer formulation of the invention and also optionally a covering layer applied to that side of the film which is remote from the carrier substrate.

The layered construction may more particularly include one or more covering layers on the film to protect the film from dirt and environmental effects. Polymeric sheets or composite sheet systems can be used for this purpose, but also clearcoats.

The covering layers used are preferably sheet materials similarly to the materials used in the carrier substrate, and these materials may have a thickness of typically 5 to 200 µm, preferably 8 to 125 µm, more preferably 20 to 50 µm.

Preference is given to covering layers having a very smooth surface. The criterion here is the roughness as determined to DIN EN ISO 4288 "Geometrical Product Specifications (GPS)—Surface texture . . . ", test condition R3z front and back. Preferred roughnesses are in the range of not more than 2 µm and preferably of not more than 0.5 µm.

The covering layers used are preferably PE or PET sheets from 20 to 60 µm in thickness. Particular preference is given to using a polyethylene sheet 40 µm in thickness.

It is likewise possible for a layered construction to have a further covering layer on the carrier substrate as a protective layer.

The invention likewise provides for the use of a holographic medium of the invention for producing a hologram, especially an in-line, off-axis, full-aperture transfer, white light transmission, Denisyuk, off-axis reflection or edge-lit hologram and also a holographic stereogram.

The holographic media of the invention can can processable into holograms in the entire visible or near UV spectrum (300-800 nm) by appropriate exposure processes for optical applications. Visual holograms comprise any hologram which is recordable by processes known to a person skilled in the art. This definition includes inter alia in-line (Gabor) holograms, off-axis holograms, full-aperture transfer holograms, white light transmission holograms ("rainbow holograms"), Denisyuk holograms, off-axis reflection holograms, edge-lit holograms and also holographic stereograms. Preference is given to reflection holograms, Denisyuk holograms, transmission holograms.

Possible optical functions of the holograms obtainable using the media of the present invention correspond to the optical functions of light elements such as lenses, mirrors, deflectors, filters, diffuser screens, diffraction elements, light conductors, waveguides, projection screens and/or masks. Frequently, these optical elements show a frequency selectivity, depending on how the holograms were exposed and on the dimensions of the hologram.

In addition, the holographic media of the invention can also be used to produce holographic pictures or images, for example for personal portraits, biometric representations in security documents or generally of images or image structures for advertising, security labels, brand protection, branding, labels, design elements, decorations, illustrations, multi-journey tickets, images and the like, and also images which can represent digital data, inter alia also in combination with the products described above. Holographic images can give the impression of a three-dimensional image, but they may also represent image sequences, short films or a number of different objects, depending on the angle from which they are illuminated, the light source (including moving light source) with which they are illuminated, etc. It is because of these diverse design possibilities that holograms, more particularly volume holograms, constitute an attractive technical solution for the abovementioned use.

BRIEF DESCRIPTIONS OF THE DRAWINGS

FIG. 1 shows curing the matrix network from liquid to beyond the gel point.

FIG. 2 shows an Arrhenius plot of gel time $t_{Gel}$ versus the inverse absolute temperature $1/T$.

FIG. 3 shows the schematic construction of the coating apparatus used.

The invention will now be more particularly described with reference to examples.

Unless otherwise stated, all percentages are by weight.

Designations Used Hereinbelow:

Photopolymer formulations comprising:

Three-dimensionally crosslinked organic matrix polymers A) constructed as precursors from
    a polyisocyanate component a)
    and an isocyanate-reactive polyol component b) and
    three-dimensionally crosslinked using a catalyst c);

writing monomers B) which have groups (radiation-curable groups) which on exposure to actinic radiation react with ethylenically unsaturated compounds by polymerization, and are present in the matrix polymers in a dissolved or dispersed state a photoinitiator C)

optionally a plasticizer D)

optionally a solvent d), optionally free-radical stabilizers, additives and also other auxiliary and/or admixture agents E)

Methods of Measurement:

OH Numbers

Reported OH numbers were determined according to DIN 53240-2.

NCO Values

Reported NCO values (isocyanate contents) were determined according to DIN EN ISO 11909.

Molecular Weights

Molecular weights were determined using gel permeation chromatography (GPC). Polystyrene standards having a molecular weights of Mp 1 000 000 to 162 are used for calibration. Tetrahydrofuran for analysis is used as eluent. The following parameters are maintained in the duplicate measurement:

- degassing: online degasser
- flow rate: 1 ml/min
- analysis time: 45 minutes
- detectors: refractometer and UV detector
- injection volume: 100 µl-200 µl Molar mass means $M_w$, $M_n$ and $M_p$ and the polydispersity $M_w/M_n$ are calculated with software support. Base line points and evaluation limits are fixed in accordance with DIN 55672 Part 1.

Viscosities

The component or mixture to be measured for viscosity was applied, unless otherwise stated, at 20° C. in a cone-plate measuring system of a rheometer (an MCR 51 from Anton Paar Physica). The measurement was carried out under the following conditions:

- measurement body: cone CP 25, d=25 mm, angle=1°
- measurement gap as distance between cone and plate: 0.047 mm
- measurement time: 10 seconds
- determination of viscosity at a shear rate of 250 1/second Solids Contents Solids contents were determined either by following the user instructions of an IR balance to apply about 1 g of substance to a disposable aluminum dish and heat at 140° C. until there was a constant weight for 30 seconds or by applying about 1 g of substance to a special disposable aluminum dish (suitable for systems having a maximum solvent content of 10 wt %) and heating at 125° C. for 60 minutes in a drying cabinet. A suitably bent paper clip was used to distribute the substance to be determined such that uniform drying of the film was ensured. The paper clip remained in the sample during the measurement and had to be taken into account in the initial weight.

Measurement of Gel Point $G_{Gel}$ and $t_{Gel}$ of Photopolymer Formulations and of Activation of Temperature $T_{Akt}$ The gel points $G_{Gel}$ and $t_{Gel}$ and the activation temperatures $T_{Akt}$ were determined on formulations without photoinitiator, since the latter is not needed for the measurements and the gel points $G_{Gel}$ and $t_{Gel}$ and the activation temperatures $T_{Akt}$ are not influenced by the presence of the photoinitiator in the formulation.

Measurement of Gel Point $G_{Gel}$ and $t_{Gel}$ of Photopolymers Using an Oscillatory Rheometer of The photopolymer formulation for determining the gel point $G_{Gel}$ and $t_{Gel}$ was prepared by dissolving component B) and also optionally additives in polyol component b). Any heating in the drying cabinet at 60° C. was limited to a maximum of 10 minutes. Heating was unnecessary when the components were already liquid. Polyisocyanate component a) was then added with mixing in a Speedmixer for 1 minute. Then, a solution of component c) in component d) was added with renewed mixing in the Speedmixer for 1 minute. The concentration of component c) in component d) was 5 or 10 wt %. This solution was used in the amounts described as in table 1.

The still liquid formulation was then introduced into the plate—plate measuring system of a rheometer (an MCR 301 from Anton Paar Physica, equipped with the oven model CTD 450, which had been preheated to the temperature T). The curing of the matrix of the photopolymer formulation over time was then measured under the following conditions:

- plate spacing 250 µm.
- oscillatory mode at a constant frequency f of 10 Hz and a regulated deformation amplitude of 10%.
- temperature T at 303 K or 313 K or 328 K or 343 K or 353 K, normal force regulation set to 0 newtons.
- recording of storage modulus G' and of loss modulus G" over the measurement time t at least until the condition of the gel point G'=G"=$G_{Gel}$ at time $t_{Gel}$ was reached.

FIG. 1 by way of example shows the course of the curing of the matrix network until beyond the gel point. At the start there was the liquid photopolymer formulation, for which G">G' holds. The ensuing crosslinking caused the elasticity to increase until the storage modulus G'=G"=$G_{Gel}$ at time $t_{Gel}$. This defines the gel point. In the course of the further continuing crosslinking of the matrix G' then remained >G".

Determination of Activation Temperature $T_{Akt}$ of Photopolymer Formulation

The gel time $t_{Gel}$ will be dependent on the temperature, since it is likely that at elevated temperature, at which the matrix cures, the catalyst (component c)) is more active. Therefore, $t_{Gel}$ was determined at different temperatures T for one and the same photopolymer formulation. The values obtained for $t_{Gel}$ were then plotted against the corresponding inverse absolute temperature 1/T, given in 1/K. If a logarithmic scale of the y-axis is chosen for this, a linear dependency is obtained, which is given as:

$$\ln(t_{Gel}/\min)=T_{Akt}/T+A \qquad \text{formula (1)}$$

The activation temperature $T_{Akt}$ was then determined using linear regression.

FIG. 2 shows the above-described temperature dependence of $t_{Gel}$ by way of example.

Measuring the Layer Thickness of Photopolymer Layers

The physical layer thickness was determined using the commercially available white light interferometer FTM-Lite NIR layer thickness measuring instrument from Ingenieursbüro Fuchs.

Employed Materials

Employed Polyisocyanate Components a)

Isocyanate component 1 (component a1), Desmodur N 3900, is a product from Bayer MaterialScience AG, Leverkusen, Germany, polyisocyanate based on hexane diisocyanate, proportion of iminooxadiazinedione at least 30%, NCO content: 23.5%

Isocyanate component 2 (component a2), Desmodur XP 2599, is a product from Bayer MaterialScience AG, Leverkusen, Germany, full allophanate of hexane diisocyanate on Acclaim 4200, NCO content: 5.6-6.4%

Isocyanate component 3 (component a3), Desmodur XP 2747, is a product from Bayer MaterialScience AG, Leverkusen, Germany, full allophanate of hexane diisocyanate on polypropylene glycol having number-average molar mass of about 280 g/mol, NCO content: 16.5-17.3%.

Employed Isocyanate-Reactive Components (Components b)

Polyol 1 (component b1) is a product from Bayer MaterialScience AG, Leverkusen, Germany, the preparation is described hereinbelow.

Polyol 2 (component b2), Acclaim 4200, is a product from Bayer MaterialScience AG, Leverkusen, Germany, polypropylene oxide of number-average molar mass 4000 g/mol.

Polyol 3 (component b3) is a product from Bayer MaterialScience AG, Leverkusen, Germany, the preparation is described hereinbelow.

Employed Acrylates (Component B)

Acrylate 1 (component B1), [1072455-04-9], is a product from Bayer MaterialScience AG, Leverkusen, Germany, the preparation is described hereinbelow.

Acrylate 2 (component B2), [1207339-61-4], is a product from Bayer MaterialScience AG, Leverkusen, Germany, the preparation is described hereinbelow.

Acrylate 3 (component B3) is a mixture of equal parts by weight of component B1) and component B2).

Employed Components of Photoinitiator Systems (Component C)

Coinitiator 1 tetrabutylammonium tris(3-chloro-4-methylphenyl)(hexyl)borate, [1147315-11-4]) is a product obtainable from BASF SE, Basle, Switzerland, in 2010.

Dye 1 is new methylene blue [1934-16-3] and was obtained from SIGMA-ALDRICH CHEMIE GmbH, Steinheim, Germany.

Dye 2 is safranine O [1477-73-6] and was obtained from SIGMA-ALDRICH CHEMIE GmbH, Steinheim, Germany.

Dye 3 is Astrazone Orange G [13056-93-7] and was obtained from SIGMA-ALDRICH CHEMIE GmbH, Steinheim, Germany.

Employed Nonphotopolymerizable Components (Component D)

The nonphotopolymerizable component (component D) is a product from Bayer MaterialScience AG, Leverkusen, Germany, the preparation of which is described hereinbelow.

Employed Catalysts (Components c Dissolved in Component d)

Catalyst 1 (component c1): urethanization catalyst Fomrez UL 28, dimethylbis[(1-oxoneodecl)oxy]stannane, product from Momentive Performance Chemicals, Wilton, Conn., USA.

Catalyst 2 (component c2): urethanization catalyst Fomrez UL 29, di-n-octyltin bis(isooctyl mercaptoacetate), product from Momentive Performance Chemicals, Wilton, Conn., USA.

Catalyst 3 (component c3): urethanization catalyst Fomrez UL 38, dioctyltin di-neodecanoate, product from Momentive Performance Chemicals, Wilton, Conn., USA.

Catalyst 4 (component c4): urethanization catalyst Fomrez UL 50, dimethylbis(oleoyloxy)stannane, product from Momentive Performance Chemicals, Wilton, Conn., USA.

Catalyst 5 (component c5): urethanization catalyst Fomrez UL 54, dimethyltin bis(2-ethylhexyl mercaptoacetate), product from Momentive Performance Chemicals, Wilton, Conn., USA.

Catalyst 6 (component c6): urethanization catalyst, dibutyltin dilaurate, product from Sigma Aldrich Co., St. Louis, Mo., USA.

Catalyst 7 (component c7): urethanization catalyst, butyltin tris(2-ethylhexanoate), product from Arkema GmbH, Düsseldorf, Germany.

Catalyst 8 (component c8): urethanization catalyst iron [III] acetylacetonate, iron[III] tris-acetylacetonate, product from Sigma Aldrich Co., St. Louis, Mo., USA.

Catalyst 9 (component c9): urethanization catalyst BorchiKat 24, bismuth(III) tris(2-ethylhexanoate), product from OMG Borchers GmbH, Langenfeld, Germany.

Catalyst 10 (component c10): urethanization catalyst BorchiKat 28, tin(II) bis(2-ethylhexanoate), product from OMG Borchers GmbH, Langenfeld, Germany.

Catalyst 11 (component c11): urethanization catalyst tin (II) octoate (CAS 1912-83-0) was obtained from BNT Chemicals GmbH, Bitterfeld, Germany.

Catalyst 12 (component c12): urethanization catalyst iron [III] acetylacetonate was obtained from Acros Organics BVBA, Geel, Belgium.

Employed Solvents (Components d)

Solvent 1 (component d1): N-ethylpyrrolidone

Solvent 2 (component d2): butyl acetate

Solvent 3 (component d3): ethyl acetate

Employed Auxiliary and Admixture Agents (Components E)

BYK® 310: silicone-based surface additive from BYK-Chemie GmbH, Wesel, Germany (component E1) (25% strength solution in xylene)

Desmorapid® Z (dibutyltin dilaurate) is a urethanization catalyst and product from Bayer MaterialScience AG, Leverkusen, Germany DMC catalyst: double metal cyanide catalyst based on zinc hexacyanocobaltate(III), obtainable by the method described in EP 700 949 A.

Irganox 1076 is octadecyl 3,5-di-(tert)-butyl-4-hydroxyhydrocinnamate [2082-79-3].

Preparation of Components

Preparation of Polyol 1 (Component b1)

In a 1 L flask, 0.18 g of tin octoate, 374.8 g of ε-caprolactone and 374.8 g of a difunctional polytetrahydrofuran polyetherpolyol (equivalent weight 500 g/mol OH) were initially charged and heated to 120° C. and maintained at 120° C. until the solids content (proportion of nonvolatiles) was 99.5 wt % or above. This was followed by cooling to obtain the product as a waxy solid.

Preparation of Polyol 3 (Component b3)

A 20 L reaction tank equipped with a stirrer was charged with 2475 g of a difunctional polytetrahydrofuran polyetherpolyol (equivalent weight 325 g/mol OH) followed by 452.6 mg of DMC catalyst. The temperature was then raised to 105° C. while stirring at about 70 rpm. Air was exchanged for nitrogen by threefold application of vacuum and venting with nitrogen. After the stirrer speed had been increased to 300 rpm, nitrogen was upwardly passed through the mixture for 57 minutes while the vacuum pump was in operation and the pressure was about 0.1 bar. Thereafter, a pressure of 0.5 bar was established with nitrogen and 100 g of ethylene oxide (EO) and 150 g of propylene oxide (PO) were introduced concurrently to start the polymerization. The pressure rose to 2.07 bar in the process. After 10 minutes, the pressure had gone back down to 0.68 bar and a further 5.116 kg of EO and 7.558 kg of PO were introduced as a mixture at 2.34 bar over 1 h 53 min. 31 minutes after completion of epoxide addition vacuum was applied at a residual pressure of 2.16 bar for complete degassing. The product was stabilized by addition of 7.5 g of Irganox 1076 to obtain a slightly cloudy viscous liquid (OH number 27.1 mg KOH/g, viscosity at 25° C.: 1636 mPas).

Preparation of acrylate 1 (component B1) (phosphorus thioyltris(oxy-4,1-phenyleneimino-carbonyloxy-ethane-2,1-diyl) triacrylate)

In a 500 ml round-bottom flask, 0.1 g of 2,6-di-tert-butyl-4-methylphenol, 0.05 g of dibutyltin dilaurate (Desmorapid® Z, Bayer MaterialScience AG, Leverkusen, Germany) and also 213.07 g of a 27% solution of tris(p-isocyanatophenyl) thiophosphate in ethyl acetate (Desmodur® RFE, product from Bayer MaterialScience AG, Leverkusen, Germany)

were initially charged and heated to 60° C. Thereafter, 42.37 g of 2-hydroxyethyl acrylate were added dropwise and the mixture was further maintained at 60° C. until the isocyanate content had dropped below 0.1%. This was followed by cooling and complete removal of the ethyl acetate under reduced pressure to obtain the product as a partly crystalline solid.

Preparation of acrylate 2 (component B2) 2-({[3-(methylsulfanyl)phenyl]carbamoyl}-oxy)ethyl prop-2-enoate)

In a 100 ml round-bottom flask, 0.02 g of 2,6-di-tert-butyl-4-methylphenol, 0.01 g of Desmorapid® Z, 11.7 g of 3-(methylthio)phenyl isocyanate were initially charged and heated to 60° C. Thereafter, 8.2 g of 2-hydroxyethyl acrylate were added dropwise and the mixture was further maintained at 60° C. until the isocyanate content had dropped below 0.1%. This was followed by cooling to obtain the product as a pale yellow liquid.

Preparation of Photoinitiator System 1 (Component C1)

In a glass beaker, 0.10 g of dye 1, 0.05 g of dye 2, 0.05 g of dye 3, 1.50 g of coinitiator 1 were dissolved in 3.50 g of N-ethylpyrrolidone in the dark or under suitable lighting. The appropriate weight percentages of this solution were used to prepare the example media.

Preparing the nonphotopolymerizable component (component D) (bis(2,2,3,3,4,4,5,5,6,6,7,7-dodecafluoroheptyl) (2,2,4-trimethylhexane-1,6-diyl) biscarbamate)

In a 50 ml round-bottom flask, 0.02 g of dibutyltin dilaurate (Desmorapid Z, Bayer MaterialScience AG, Leverkusen, Germany) and 3.6 g of 2,4,4-trimethylhexane 1,6-diisocyanate (Vestanat TMDI, Evonik, Germany) were initially charged and heated to 60° C. This was followed by the dropwise addition of 11.9 g of 2,2,3,3,4,4,5,5,6,6,7,7-dodecafluoroheptan-1-ol and the mixture was further maintained at 60° C. until the isocyanate content had dropped below 0.1%. This was followed by cooling to obtain the product as a colorless oil.

Preparation of Photopolymer Formulation without Photoinitiator to Determine the Gel Point $G_{Gel}$ and and the Activation Temperature $T_{Akt}$ Table 1 lists the investigated examples of photopolymer formulations to determine the gel point $G_{Gel}$ and $t_{Gel}$ and the activation temperature $T_{Akt}$ in terms of their composition. These photopolymer formulations were prepared in accordance with the protocol described in the section "Measurement of gel point $G_{Gel}$ and $t_{Gel}$ of photopolymers using an oscillatory rheometer".

TABLE 1

Photopolymer formulation without photoinitiator to determine the gel point $G_{Gel}$ and $t_{Gel}$.

| Photopolymer formulation without photoinitiator | Polyisocyanate component | Proportion (g) | Polyol component | Proportion (g) | NCO:OH | Writing monomer | Proportion (g) | Nonreactive component |
|---|---|---|---|---|---|---|---|---|
| Comparative 1 | a1 | 0.648 | b1 | 3.499 | 1 | B3 | 3.000 | D |
| Comparative 2 | a1 | 0.648 | b1 | 3.499 | 1 | B3 | 3.000 | D |
| Comparative 3 | a2 | 0.924 | b2 | 2.751 | 1 | B1 | 1.250 | |
| Comparative 4 | a2 | 0.950 | b2 | 2.622 | 1 | B1 | 1.250 | |
| Comparative 5 | a2 | 0.996 | b2 | 2.751 | 1 | B1 | 1.250 | |
| Comparative 6 | a3 | 0.465 | b3 | 3.679 | 1 | B3 | 3.000 | D |
| Comparative 7 | a3 | 0.465 | b3 | 3.679 | 1 | B3 | 3.000 | D |
| Comparative 8 | a3 | 0.465 | b3 | 3.679 | 1 | B3 | 3.000 | D |
| Comparative 9 | a1 | 0.349 | b3 | 3.759 | 1 | B3 | 3.000 | D |
| Comparative 10 | a1 | 0.349 | b3 | 3.759 | 1 | B3 | 3.000 | D |
| Comparative 11 | a1 | 0.349 | b3 | 3.759 | 1 | B3 | 3.000 | D |
| Comparative 12 | a1 | 0.648 | b1 | 3.499 | 1 | B3 | 3.000 | D |
| Comparative 13 | a1 | 0.648 | b1 | 3.499 | 1 | B3 | 3.000 | D |
| Comparative 14 | a1 | 0.648 | b1 | 3.499 | 1 | B3 | 3.000 | D |
| Comparative 15 | a1 | 0.648 | b1 | 3.499 | 1 | B3 | 3.000 | D |
| Comparative 16 | a1 | 0.648 | b1 | 3.499 | 1 | B3 | 3.000 | D |
| Comparative 17 | a1 | 0.648 | b1 | 3.499 | 1 | B3 | 3.000 | D |
| Comparative 18 | a1 | 0.648 | b1 | 3.499 | 1 | B3 | 3.000 | D |
| Comparative 19 | a1 | 0.648 | b1 | 3.499 | 1 | B3 | 3.000 | D |
| Comparative 20 | a1 | 0.648 | b1 | 3.499 | 1 | B3 | 3.000 | D |
| Comparative 21 | a1 | 0.706 | b1 | 3.781 | 1 | B3 | 3.000 | D |
| Comparative 22 | a1 | 0.706 | b1 | 3.781 | 1 | B3 | 3.000 | D |
| Comparative 23 | a1 | 0.667 | b1 | 3.480 | 1 | B3 | 3.000 | D |
| Comparative 24 | a1 | 0.595 | b1 | 3.104 | 1 | B3 | 3.000 | D |
| Comparative 25 | a1 | 0.667 | b1 | 3.480 | 1 | B3 | 3.000 | D |
| Comparative 26 | a1 | 0.595 | b1 | 3.104 | 1 | B3 | 3.000 | D |
| Inventive 1 | a1 | 0.648 | b1 | 3.499 | :1 | B3 | 3.000 | D |
| Inventive 2 | a1 | 0.594 | b1 | 3.099 | 1 | B3 | 3.000 | D |
| Inventive 3 | a1 | 0.648 | b1 | 3.499 | 1 | B3 | 3.000 | D |
| Inventive 4 | a1 | 0.706 | b1 | 3.781 | 1 | B3 | 3.000 | D |
| Inventive 5 | a1 | 0.706 | b1 | 3.781 | 1 | B3 | 3.000 | D |
| Inventive 6 | a1 | 0.706 | b1 | 3.781 | 1 | B3 | 3.000 | D |
| Inventive 7 | a2 | 0.996 | b2 | 2.751 | 1 | B1 | 1.250 | |
| Inventive 8 | a2 | 0.950 | b2 | 2.622 | 1 | B1 | 1.250 | |
| Inventive 9 | a3 | 0.465 | b3 | 3.679 | 1 | B3 | 3.000 | D |
| Inventive 10 | a3 | 0.414 | b3 | 3.279 | 1 | B3 | 3.000 | D |
| Inventive 11 | a1 | 0.349 | b3 | 3.795 | 1 | B3 | 3.000 | D |

TABLE 1-continued

Photopolymer formulation without photoinitiator to determine the gel point $G_{Gel}$ and $t_{Gel}$.

| | | | | | | | | |
|---|---|---|---|---|---|---|---|---|
| Inventive 12 | a1 | 0.311 | b3 | 3.382 | 1 | B3 | 3.000 | D |
| Inventive 13 | a1 | 0.706 | b1 | 3.781 | 1 | B3 | 3.000 | D |
| Inventive 14 | a1 | 0.706 | b1 | 3.781 | 1 | B3 | 3.000 | D |
| Inventive 15 | a1 | 0.706 | b1 | 3.781 | 1 | B3 | 3.000 | D |
| Inventive 16 | a1 | 0.706 | b1 | 3.781 | 1 | B3 | 3.000 | D |

| Photopolymer formulation without photoinitiator | Proportion (g) | Catalyst | Proportion in formulation (wt %) | Solvent for catalyst | Concentration of catalyst solution (wt %) | Solvent for photoinitiator | Proportion in formulation (wt %) |
|---|---|---|---|---|---|---|---|
| Comparative 1 | 2.5 | c1 | 0.0300 | d1 | 10 | d1 | 3.5 |
| Comparative 2 | 2.5 | c1 | 0.0300 | d2 | 10 | d1 | 3.5 |
| Comparative 3 | | c1 | 0.0500 | d2 | 10 | | |
| Comparative 4 | | c1 | 0.0500 | d1 | 10 | d1 | 3.5 |
| Comparative 5 | | c1 | 0.0500 | d1 | 10 | | |
| Comparative 6 | 2.5 | c1 | 0.0300 | d2 | 10 | d1 | 3.5 |
| Comparative 7 | 2.5 | c1 | 0.1000 | d2 | 10 | d1 | 3.5 |
| Comparative 8 | 2.5 | c1 | 0.1500 | d2 | 10 | d1 | 3.5 |
| Comparative 9 | 2.5 | c1 | 0.0300 | d2 | 10 | d1 | 3.5 |
| Comparative 10 | 2.5 | c1 | 0.1000 | d2 | 10 | d1 | 3.5 |
| Comparative 11 | 2.5 | c1 | 0.1500 | d2 | 10 | d1 | 3.5 |
| Comparative 12 | 2.5 | c4 | 0.0300 | d1 | 10 | d1 | 3.5 |
| Comparative 13 | 2.5 | c4 | 0.0700 | d1 | 10 | d1 | 3.5 |
| Comparative 14 | 2.5 | c3 | 0.0300 | d1 | 10 | d1 | 3.5 |
| Comparative 15 | 2.5 | c3 | 0.0700 | d1 | 10 | d1 | 3.5 |
| Comparative 16 | 2.5 | c5 | 0.0700 | d1 | 10 | d1 | 3.5 |
| Comparative 17 | 2.5 | c5 | 0.0700 | d1 | 10 | d1 | 3.5 |
| Comparative 18 | 2.5 | c5 | 0.0300 | d2 | 10 | d1 | 3.5 |
| Comparative 19 | 2.5 | c2 | 0.0300 | d1 | 10 | d1 | 3.5 |
| Comparative 20 | 2.5 | c2 | 0.0300 | d2 | 10 | d1 | 3.5 |
| Comparative 21 | 2.5 | c6 | 0.0100 | d2 | 10 | | |
| Comparative 22 | 2.5 | c6 | 0.0600 | d2 | 10 | | |
| Comparative 23 | 2.5 | c11 | 0.0100 | d1 | 10 | d1 | 3.5 |
| Comparative 24 | 2.5 | c11 | 0.0100 | d1 | 10 | d3 | 8.0 |
| Comparative 25 | 2.5 | c12 | 0.0100 | d1 | 10 | d1 | 3.5 |
| Comparative 26 | 2.5 | c12 | 0.0100 | d1 | 10 | d3 | 8.0 |
| Inventive 1 | 2.5 | c7 | 0.0700 | d1 | 10 | d1 | 3.5 |
| Inventive 2 | 2.5 | c7 | 0.0700 | d3 | 10 | d3 | 8.0 |
| Inventive 3 | 2.5 | c7 | 0.0700 | d2 | 10 | d1 | 3.5 |
| Inventive 4 | 2.5 | c7 | 0.0100 | d1 | 10 | | |
| Inventive 5 | 2.5 | c7 | 0.0400 | d1 | 10 | | |
| Inventive 6 | 2.5 | c7 | 0.0500 | d1 | 10 | | |
| Inventive 7 | | c7 | 0.0700 | d1 | 10 | | |
| Inventive 8 | | c7 | 0.0700 | d1 | 10 | d1 | 3.5 |
| Inventive 9 | 2.5 | c7 | 0.0700 | d1 | 10 | d1 | 3.5 |
| Inventive 10 | 2.5 | c7 | 0.0700 | d1 | 10 | d3 | 8.0 |
| Inventive 11 | 2.5 | c7 | 0.0700 | d1 | 10 | d1 | 3.5 |
| Inventive 12 | 2.5 | c7 | 0.0700 | d1 | 10 | d3 | 8.0 |
| Inventive 13 | 2.5 | c8 | 0.0100 | d1 | 5 | | |
| Inventive 14 | 2.5 | c8 | 0.0500 | d1 | 5 | | |
| Inventive 15 | 2.5 | c9 | 0.0100 | d2 | 10 | | |
| Inventive 16 | 2.5 | c10 | 0.0100 | d2 | 10 | | |

Activation Temperatures $T_{Akt}$ of Photopolymer Formulations

Table 2 presents the results of determining the activation temperatures $T_{Akt}$ of the photopolymer formulations.

TABLE 2

Preparation of activation temperatures of various photopolymer formulations.

| Example type | Catalyst | Amount of catalyst (wt %) | Solvent for catalyst | NCO:OH | Additional solvent | Amount of additional solvent (wt %) | $T_{Akt}$ (K) |
|---|---|---|---|---|---|---|---|
| Comparative 1 | c1 | 0.03 | d1 | 1.02:1 | d1 | 3.5 | 7350 |
| Comparative 2 | c1 | 0.03 | d2 | 1.02:1 | d1 | 3.5 | 6870 |
| Comparative 3 | c1 | 0.05 | d2 | 1.02:1 | | | 7380 |
| Comparative 4 | c1 | 0.05 | d1 | 1.02:1 | d1 | 3.5 | 7860 |
| Comparative 5 | c1 | 0.05 | d1 | 1.02:1 | | | 7720 |
| Comparative 6 | c1 | 0.03 | d2 | 1.02:1 | d1 | 3.5 | 7380 |
| Comparative 7 | c1 | 0.10 | d2 | 1.02:1 | d1 | 3.5 | 7040 |
| Comparative 8 | c1 | 0.15 | d2 | 1.02:1 | d1 | 3.5 | 7220 |
| Comparative 9 | c1 | 0.03 | d2 | 1.02:1 | d1 | 3.5 | 7980 |

TABLE 2-continued

Preparation of activation temperatures of various photopolymer formulations.

| Example type | Catalyst | Amount of catalyst (wt %) | Solvent for catalyst | NCO:OH | Additional solvent | Amount of additional solvent (wt %) | $T_{Akt}$ (K) |
|---|---|---|---|---|---|---|---|
| Comparative 10 | c1 | 0.10 | d2 | 1.02:1 | d1 | 3.5 | 7530 |
| Comparative 11 | c1 | 0.15 | d2 | 1.02:1 | d1 | 3.5 | 7600 |
| Comparative 12 | c4 | 0.03 | d1 | 1.02:1 | d1 | 3.5 | 8020 |
| Comparative 13 | c4 | 0.07 | d1 | 1.02:1 | d1 | 3.5 | 7380 |
| Comparative 14 | c3 | 0.03 | d1 | 1.02:1 | d1 | 3.5 | 8020 |
| Comparative 15 | c3 | 0.07 | d1 | 1.02:1 | d1 | 3.5 | 7380 |
| Comparative 16 | c5 | 0.07 | d2 | 1.02:1 | d1 | 3.5 | 6200 |
| Comparative 17 | c5 | 0.07 | d1 | 1.02:1 | d1 | 3.5 | 5950 |
| Comparative 18 | c5 | 0.03 | d1 | 1.02:1 | d1 | 3.5 | 6470 |
| Comparative 19 | c2 | 0.03 | d1 | 1.02:1 | d1 | 3.5 | 6780 |
| Comparative 20 | c2 | 0.03 | d2 | 1.02:1 | d1 | 3.5 | 6420 |
| Comparative 21 | c6 | 0.01 | d2 | 1.02:1 | | | 5290 |
| Comparative 22 | c6 | 0.06 | d2 | 1.02:1 | | | 5690 |
| Comparative 23 | c11 | 0.01 | d1 | 1.02:1 | d1 | 3.5 | 5750 |
| Comparative 24 | c11 | 0.01 | d1 | 1.02:1 | d3 | 8.0 | 5610 |
| Comparative 25 | c12 | 0.01 | d1 | 1.02:1 | d1 | 3.5 | 7540 |
| Comparative 26 | c12 | 0.01 | d1 | 1.02:1 | d3 | 8.0 | 2840 |
| Inventive 1 | c7 | 0.07 | d1 | 1.02:1 | d1 | 3.5 | 9520 |
| Inventive 2 | c7 | 0.07 | d3 | 1.02:1 | d3 | 8.0 | 10040 |
| Inventive 3 | c7 | 0.07 | d2 | 1.02:1 | d1 | 3.5 | 9140 |
| Inventive 4 | c7 | 0.01 | d1 | 1.02:1 | | | 9260 |
| Inventive 5 | c7 | 0.04 | d1 | 1.02:1 | | | 9810 |
| Inventive 6 | c7 | 0.05 | d1 | 1.02:1 | | | 9520 |
| Inventive 7 | c7 | 0.07 | d1 | 1.02:1 | | | 9220 |
| Inventive 8 | c7 | 0.07 | d1 | 1.02:1 | d1 | 3.5 | 8770 |
| Inventive 9 | c7 | 0.07 | d1 | 1.02:1 | d1 | 3.5 | 10040 |
| Inventive 10 | c7 | 0.07 | d1 | 1.02:1 | d3 | 8.0 | 10330 |
| Inventive 11 | c7 | 0.07 | d1 | 1.02:1 | d1 | 3.5 | 10020 |
| Inventive 12 | c7 | 0.07 | d1 | 1.02:1 | d3 | 8.0 | 11380 |
| Inventive 13 | c8 | 0.01 | d1 | 1.02:1 | | | 8550 |
| Inventive 14 | c8 | 0.05 | d1 | 1.02:1 | | | 8530 |
| Inventive 15 | c9 | 0.01 | d2 | 1.02:1 | | | 12540 |
| Inventive 16 | c10 | 0.01 | d2 | 1.02:1 | | | 9550 |

Production of Holographic Media on a Sheet Coating Apparatus

The continuous production will now be described of holographic media in the form of films from inventive and noninventive photopolymer formulations.

FIG. 3 shows the schematic construction of the coating apparatus used. The individual parts have the following reference signs therein:

| 1 | Stock reservoir vessel |
| 2 | Metering appliance |
| 3 | Vacuum degassing appliance |
| 4 | Filter |
| 5 | Static mixer |
| 6 | Coating appliance |
| 7 | Circulating air dryer |
| 8 | Carrier substrate |
| 9 | Covering layer |

Polyol component b) was incrementally admixed with the writing monomers B), the plasticizers D), the catalyst c) and the surface-active additive BYK® 310 (component E) to produce the photopolymer formulation. A solution of component C) was then added to the mixture in the dark and mixed in to obtain a clear solution. If necessary, the formulation was briefly heated at 60° C. to hasten the dissolving of the starting materials. This mixture was introduced into one of the two stock reservoir vessels 1 of the coating apparatus. The second stock reservoir vessel 1 was filled with the polyisocyanate component a). Both the components were then each conveyed by the metering appliances 2 to the vacuum degassing appliance 3 and degassed. They were then each passed through the filters 4 into the static mixer 5 where the components were mixed to form the photopolymer formulation. The liquid mass obtained was then fed to the coating appliance 6.

The coating appliance was 6 was in the present case a conventional blade-coating system (a doctor blade). But, as an alternative, it is also possible to use a slot die. Using the coating appliance 6, the photopolymer formulation was applied at a processing temperature of 20° C. to a carrier substrate 8 in the form of a polycarbonate sheet 175 μm in thickness and dried for 5.8 minutes at a crosslinking temperature of 80° C. in a circulating air dryer 7. This gave a medium in the form of a film which was then covered with a 40 μm thick polyethylene sheet as covering layer 9 and wound up.

The desired target layer thickness of the film was preferably between 10 to 60 μm, while the layer thicknesses obtained for the holographic sheets produced are discernible in table 3.

The production speeds were preferably in the range from 0.2 m/min to 300 m/min and more preferably in the range from 1.0 m/min to 50 m/min.

Validation of Suitability of Inventive Photopolymer Formulations for Producing Large-Scale Industrial Production of Holographic Media in the Form of Films The continuous production of holographic films from a photopolymer formulation on the coating apparatus described above is decisively dependent, first, on the pot life of the photopolymer formulation and, secondly, on its reaction time to complete crosslinking, if a continuous homogeneous coating is to be achieved. The two aspects are elucidated hereinbelow.

1. Pot Life of Photopolymer Mixture at the Appropriate Processing Temperature

A very important factor in the production of continuous films is the pot life of the photopolymer formulation from the start of mixing to the point of application. An infinitely long pot life at the appropriate processing temperature is preferable, since it ensures trouble-free processing of the formulation.

The pot life on a coating apparatus was assessed by visual inspection of the coated carrier substrate downstream of the coating appliance. When the pot life was too short, the viscosity would rise significantly during the coating process while still within the coating appliance. This led during the coating operation to a diffuse formation of stripes which was found in the extreme case to lead to uncoated fields of wetting which were of significant size. Photopolymer clumps extending in the longitudinal direction can further be observed on the carrier substrate. The time until such effects were observed constituted a measure for assessing the pot life of different systems.

and already highly-crosslinked, are considered. They additionally also depend on the concentration of the catalyst, complicating any assessment directed to achieving the problem addressed by the present invention. The gel point is exactly therebetween and defines the point in time when the first percolating crosslinked macromolecule is obtained (percolation threshold). It is evidently and surprisingly the case that it is precisely this gel time $t_{Gel}$ and its temperature dependence, which is expressed by the $T_{Akt}$ parameter, which is independent of the catalyst concentration, that contains all the information needed to solve the problem addressed by the present invention.

2. Reaction Time to Complete or Sufficiently Complete Crosslinking of Photopolymer Matrix:

The reaction time or residence time under certain conditions such as, for example, a certain temperature is one important factor with a significant influence on the windability/nonblockability of the photopolymer film and thus the manufacturing speed in the production of such photopolymer films. A short reaction time at the crosslinking temperature is accordingly preferred.

TABLE 3

Activation temperatures $T_{Akt}$ of photopolymer formulations versus their pot life on a coating apparatus

| Example type | Catalyst | Amount of catalyst (wt %) | Solvent for catalyst | Photoinitiator | Additional solvent | Amount of additional solvent (wt %) | Coating system | Layer thickness (μm) | $T_{Akt}$ (K) | Pot life (min) |
|---|---|---|---|---|---|---|---|---|---|---|
| Comparative 1 | c1 | 0.03 | d1 | C1 | — | — | blade | 24-26 | 7350 | 15-20 |
| Comparative 1 | c1 | 0.03 | d1 | — | — | — | blade | 16-18 | 7350 | 15-20 |
| Comparative 4 | c1 | 0.05 | d1 | C1 | — | — | blade | 53-57 | 7860 | 12-15 |
| Inventive. 1 | c7 | 0.07 | d1 | C1 | — | — | blade | 24-26 | 9520 | 35-40 |
| Inventive. 2 | c7 | 0.07 | d3 | C1 | d3 | 5.0 | blade | 15-17 | 10040 | 45-55 |
| Inventive. 2 | c7 | 0.07 | d3 | C1 | d3 | 10.0 | slot die | 15-17 | 10040 | >300 |

The results in tables 2 and 3 show that formulations having an activation temperature $T_{Akt}$>8300 K have long pot lives in the coating apparatus at room temperature. This means that the photopolymer formulations of the invention are very useful for efficient large-scale industrial manufacture of holographic media in the form of films.

The results also show that the activation temperature $T_{Akt}$ is independent of the catalyst concentration in the photopolymer formulation. Therefore, the catalyst concentration can be adjusted such that, at the relevant crosslinking temperature, a fixedly predetermined reaction time which is sensible for the economic design of the coating operation is achieved. An inventive photopolymer formulation having a high activation temperature $T_{Akt}$ will then achieve a longer pot life at room temperature than some other one which has a lower activation temperature $T_{Akt}$.

It was found that, surprisingly, the criterion for selecting a suitable catalyst for a photopolymer formulation within the meaning of the invention is the matrix network formation reaction activation temperature $T_{Akt}$ which can be determined in an oscillatory rheometer via the gel times $t_{Gel}$ determined at various temperatures T. This is surprising because it would be logical to determine the pot life by recurring to the first increase in the viscosity from the constant level of the starting mixture at the processing temperature, since the formulations exhibit good flow up to then (Thomas Mezger, "Das Rheologie Handbuch", Vincentz Verlag Hannover, page 59) and to determine the time to reach windability or nonblockability by recurring to the time to reach a sufficiently high storage modulus G' at the crosslinking temperature. That is, timescales in rheologically completely different states, viz., liquid Two features of the final product are determinative for the assessment of windability. First, the homogeneity of the photopolymer film thickness is visually important. The edge regions of the photopolymer in the transport direction of the web are particularly conspicuous and readily assessable here. Usually slight unevennesses in the layer thicknesses can be assessed here via the pigmentation of the photopolymer in that they can be the result of the material shifting on pressure application due to the protective sheet.

The tackiness of the photopolymer film is a further important aspect. Tackiness is assessed by peeling the covering layer from the photopolymer film. During this operation, the force applied during peeling and the observation of the interface between the photopolymer and the covering layer can be used to arrive at an empirical determination of the tackiness. If the photopolymer film is destroyed in the process of peeling off the covering layer, this is a particularly strong indication of strong adherence between the photopolymer and the covering layer, which in turn is caused by insufficient nonblockability of the polymer.

Put in terms of the physics, it is the formation of a sufficiently high storage modulus G' by the three-dimensional crosslinking of the matrix polymer of the photopolymer formulation which is pivotal for good windability.

Comparing the films of Inventive Examples 1 to 3 with those of Comparative Examples 1 to 4 showed that despite the appreciably longer pot life under identical curing conditions, the photopolymer formulations of the present invention also gave films having very good windability. The films were very homogeneous and easy to separate undamaged from the covering layer.

The invention claimed is:

1. A method for preparing a photopolymer formulation comprising mixing a polyol component, a polyisocyanate component, a writing monomer, a photoinitiator, and a catalyst to form a liquid mixture and determining an activation temperature of the liquid mixture, wherein the photopolymer formulation has the activation temperature $\geq 8300$ K, and wherein the activation temperature is determined by determining both the storage modulus G' and the loss modulus G" of the mixture over a measurement time t, at least until the condition of the gel point $G'=G''=G_{Gel}$ at time $t_{Gel}$ is reached, at temperatures T=303 K, 313 K, 328 K, 343 K and 353 K using a plate-plate measuring system of a rheometer at a plate spacing of 250 μm in the oscillation mode at a constant frequency f of 10 Hz and a regulated deformation amplitude of 10%; establishing a logarithmic plot of $t_{Gel}$ versus the respective inverse absolute temperature 1/T at which $t_{Gel}$ was determined; and using linear regression to determine the activation temperature $T_{Akt}$ as per the formula $$\ln(t_{Gel}/\min)=T_{Akt}/T+A$$

as the slope of the straight line in the plot.

2. The method of claim 1, wherein the activation temperature is $\geq 8700$ K.

3. The method of claim 1, wherein the polyol component has primary OH groups.

4. The method of claim 1, wherein the polyisocyanate component is an aliphatic polyisocyanate or an aliphatic prepolymer.

5. The method of claim 1, wherein the writing monomer comprises at least one monofunctional and one multifunctional urethane (meth)acrylate.

6. The method of claim 1, wherein the photoinitiator comprises a combination of dyes by whose absorption spectra the spectral region from 400 to 800 nm is at least partly covered with at least one coinitiator adapted to the dyes.

7. The method of claim 1, wherein said photopolymer formulation further comprises a plasticizer.

8. The method of claim 7, wherein said plasticizer is a compound of formula (VI)

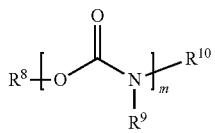

(VI)

wherein
m is $\geq 1$ and $\leq 8$; and
$R^8$, $R^9$, and $R^{10}$ are, independently of each other, hydrogen or an optionally heteroatom-substituted linear, branched, cyclic, or heterocyclic organic radical.

9. The method of claim 1, wherein the catalyst has the formula (II)

$$RSnL_3 \qquad (II)$$

wherein
R is an optionally heteroatom-substituted linear or branched alkyl radical containing from 1 to 30 carbon atoms; and
each L is, independently of the others, an $^-O_2C$—$R^3$ group, wherein $R^3$ is an optionally heteroatom-substituted linear or branched alkyl radical containing from 1 to 30 carbon atoms, an alkenyl radical containing from 2 to 30 carbon atoms, or an optionally substituted and optionally polycyclic aromatic or heteroaromatic ring.

10. The method of claim 9, wherein R is a linear or branched alkyl radical containing from 1 to 12 carbon atoms and/or R3 is a linear or branched alkenyl radical containing from 2 to 17 carbon atoms or alkyl radical containing from 1 to 17 carbon atoms optionally substituted with heteroatoms.

11. The method of claim 1, wherein the catalyst has the formula (III) or (IV)

$$Bi(III)M_3 \qquad (III),$$

$$Sn(II)M_2 \qquad (IV),$$

wherein
each M is, independently of the others, an $^-O_2C$—$R^4$ group wherein $R^4$ is a saturated or unsaturated or heteroatom-substituted $C_1$- to $C_{19}$-alkyl radical or $C_2$- to $C_{19}$ alkenyl radical.

12. The method as claimed in claim 1, characterized in that the catalyst the general formula (V)

$$FeQ_3 \qquad (V),$$

where each Q is independently of the others an organic anion of formula (Va),

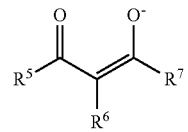

(Va)

where $R^5$ and $R^7$ are each independently of each other an optionally heteroatom-substituted $C_1$- to $C_{18}$-alkyl radical or $C_2$-$C_{18}$ alkenyl radical, especially a $C_1$- to $C_{10}$-alkyl radical and more preferably a $C_1$- to $C_4$-alkyl radical or $R^5$ and $R^6$ combine to form a bridge, for example from —$CH_2$—$CH_2$—$CH_2$—, —$CH_2$—$CH_2$—$CH_2$—$CH_2$—, —$CH_2$—$CH_2$—$CH_2$—$CH_2$—$CH_2$—, —CH=CH—CH=CH—, or an optionally heteroatom-substituted aromatic or heteroaromatic ring and $R^6$ is methyl or hydrogen.

13. A process for producing a holographic medium comprising
(I) preparing a photopolymer formulation according to the method of claim 1;
(II) processing the photopolymer formulation at a processing temperature into the form desired for the holographic medium; and
(III) curing the photopolymer formulation in the desired form by urethane formation at a crosslinking temperature above the processing temperature.

14. The process of claim 13, wherein the photopolymer formulation is processed in step II) into the form of a film.

15. The process of claim 14, wherein the photopolymer formulation is applied flat to a carrier substrate.

16. The process of claim 13, wherein the processing temperature is $\geq 15$ and $\leq 40°$ C.

17. The process of claim 13, wherein the crosslinking temperature is $\geq 60$ and $\leq 100°$ C.

* * * * *